United States Patent
Kim et al.

(10) Patent No.: US 8,829,540 B2
(45) Date of Patent: Sep. 9, 2014

(54) SEMICONDUCTOR LIGHT EMITTING DEVICE HAVING MULTI-CELL ARRAY, LIGHT EMITTING MODULE, AND ILLUMINATION APPARATUS

(75) Inventors: Sung Tae Kim, Seoul (KR); Tae Hun Kim, Gyunggi-do (KR); Jae Yoon Kim, Gyunggi-do (KR); Hae Soo Ha, Gyunggi-do (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 509 days.

(21) Appl. No.: 13/029,739

(22) Filed: Feb. 17, 2011

(65) Prior Publication Data

US 2011/0204387 A1 Aug. 25, 2011

(30) Foreign Application Priority Data

Feb. 19, 2010 (KR) .................. 10-2010-0015422

(51) Int. Cl.
*H01L 29/18* (2006.01)
*H01L 27/15* (2006.01)
*H01L 33/62* (2010.01)
*H01L 33/46* (2010.01)
*H01L 33/60* (2010.01)
*H01L 33/20* (2010.01)

(52) U.S. Cl.
CPC ............ *H01L 27/156* (2013.01); *H01L 33/62* (2013.01); *H01L 33/46* (2013.01); *H01L 33/60* (2013.01); *H01L 2224/48091* (2013.01); *H01L 2933/0091* (2013.01); *H01L 33/20* (2013.01)
USPC .................................... 257/88; 257/E33.072

(58) Field of Classification Search
USPC ........ 257/13, 79, 98, 99, 95, 102, 82, E33.06, 257/E33.062, E33.065, E33.068, E33.074
See application file for complete search history.

(56) References Cited

U.S. PATENT DOCUMENTS

| 6,547,249 | B2 | 4/2003 | Collins, III et al. |
| 7,285,801 | B2 | 10/2007 | Eliashevich et al. |

(Continued)

FOREIGN PATENT DOCUMENTS

| CN | 1402880 A | 3/2003 |
| CN | 1812117 A | 8/2006 |

(Continued)

OTHER PUBLICATIONS

Partial European Search Report issued in European Patent Application No. EP 11155000.0 dated Jun. 3, 2013.

(Continued)

*Primary Examiner* — Selim Ahmed
(74) *Attorney, Agent, or Firm* — McDermott Will & Emery LLP

(57) ABSTRACT

A semiconductor light emitting device includes a substrate, a plurality of light emitting cells, a connection part, and a concavo-convex part. The light emitting cells are arrayed on the top surface of the substrate. Each of the light emitting cells has a first-conductivity-type semiconductor layer, an active layer, and a second-conductivity-type semiconductor layer that are sequentially stacked on the top surface of the substrate. The connection part is formed to connect the light emitting cells in series, parallel or series-parallel. The concavo-convex part is formed in at least one of the bottom surface of the substrate and the top surface of an isolation region between the light emitting cells.

23 Claims, 24 Drawing Sheets

(56) References Cited

U.S. PATENT DOCUMENTS

| | | |
|---|---|---|
| 7,462,869 B2 | 12/2008 | Ohashi et al. |
| 2001/0028062 A1* | 10/2001 | Uemura et al. ............ 257/79 |
| 2006/0256826 A1 | 11/2006 | Lin et al. |
| 2006/0284195 A1* | 12/2006 | Nagai ....................... 257/98 |
| 2007/0145385 A1* | 6/2007 | Ohashi et al. ............. 257/79 |
| 2009/0045419 A1 | 2/2009 | Tsai |
| 2009/0321776 A1 | 12/2009 | Kim et al. |
| 2010/0038655 A1* | 2/2010 | Chen et al. ............... 257/88 |

FOREIGN PATENT DOCUMENTS

| | | |
|---|---|---|
| EP | 1 553 641 A1 | 7/2005 |
| EP | 1 667 228 A2 | 6/2006 |
| EP | 1 667 241 A1 | 6/2006 |
| JP | 50-12299 | 4/1975 |
| JP | 63-142685 | 6/1988 |
| JP | 02-296322 A | 12/1990 |
| JP | 05-267718 | 10/1993 |
| JP | 2001-284642 | 10/2001 |
| JP | 2001-284642 A | 10/2001 |
| JP | 2004-079867 A | 3/2004 |
| KR | 10-2006-0079737 A | 7/2006 |
| WO | WO-01/41219 A1 | 6/2001 |
| WO | 2005/022654 A2 | 3/2005 |
| WO | 2007/018390 A1 | 2/2007 |
| WO | 2009/051376 A2 | 4/2009 |

OTHER PUBLICATIONS

Chinese Office Action, w/ English translation thereof, issued in Chinese Patent Application No. CN 201110048129.6 dated Feb. 5, 2013.

Taiwanese Office Action, w/ English translation thereof, issued in Taiwanese Patent Application No. TW 100103014 dated Aug. 23, 2013.

Chinese Office Action, w/ English translation thereof, issued in Chinese Patent Application No. CN 201110048129.6 dated Oct. 15, 2013.

Extended European Search Report issued in European Patent Application No. EP 11155000.0 dated Jan. 8, 2014.

* cited by examiner

SEMICONDUCTOR LIGHT EMITTING DEVICE HAVING MULTI-CELL ARRAY, LIGHT EMITTING MODULE, AND ILLUMINATION APPARATUS

CROSS-REFERENCE TO RELATED APPLICATIONS

This application claims the priority of Korean Patent Application No. 10-2010-0015422 filed on Feb. 19, 2010, in the Korean Intellectual Property Office, the disclosure of which is incorporated herein by reference.

BACKGROUND OF THE INVENTION

1. Field of the Invention

The present invention relates to a semiconductor light emitting device, and more particularly, to a semiconductor light emitting device having an array of light emitting cells, a light emitting module including the semiconductor light emitting device, and an illumination apparatus including the light emitting module.

2. Description of the Related Art

In general, semiconductor light emitting diodes (LEDs) are advantageous for light sources in terms of power, efficiency and reliability. Therefore, semiconductor LEDs are being actively developed as high-power, high-efficiency light sources for various illumination apparatuses as well as for backlight units of display devices.

For the commercialization of such semiconductor LEDs as illumination light sources, it is necessary to increase their light efficiency and reduce their production cost while increasing their power to a desired level.

However, a high-power LED using a high-rated current may have low light efficiency due to a high current density, when compared to a low-power LED using a low-rated current.

Specifically, if a rated current is increased to obtain high luminous flux in an LED chip of the same area in order to obtain high power, the light efficiency may be degraded due to an increase in the current density. Also, the light efficiency degradation is accelerated due to heat generated by the device.

SUMMARY OF THE INVENTION

An aspect of the present invention provides a semiconductor light emitting device that improves a current density per unit area to improve the light efficiency and also the light extraction efficiency thereof.

Another aspect of the present invention provides a semiconductor light emitting device that improves a current density per unit area to improve the light efficiency and also uses a reflection structure to improve a light path.

Another aspect of the present invention provides a semiconductor light emitting device that improves a current density per unit area to improve the light efficiency and also improves the structure and location of a pad to implement a uniform current distribution over all cells.

Another aspect of the present invention provides a light emitting module including the above semiconductor light emitting device and an illumination apparatus including the light emitting module.

According to an aspect of the present invention, there is provided a semiconductor light emitting device including: a substrate; a plurality of light emitting cells arrayed on the top surface of the substrate, the light emitting cells each having a first-conductivity-type semiconductor layer, an active layer, and a second-conductivity-type semiconductor layer that are sequentially stacked on the top surface of the substrate; a connection part formed to connect the light emitting cells in series, parallel or series-parallel; and a concavo-convex part formed in at least one of the bottom surface of the substrate and the top surface of an isolation region between the light emitting cells.

The isolation region may include a region exposing the substrate, and the concavo-convex part may be formed in the exposed region of the substrate.

The isolation region may include a region exposing the first-conductivity-type semiconductor layer, and the concavo-convex part may be formed in the exposed region of the first-conductivity-type semiconductor layer.

The concavo-convex part may be formed in the majority of the regions of the top surface of the substrate.

The concavo-convex part may be formed in the bottom surface of the substrate. The concavo-convex part on the bottom surface of the substrate may be formed of a groove part with an inclined side surface inclined toward a top portion where the light emitting cell is formed. The semiconductor light emitting device may further include a reflective metal layer formed on the bottom surface of the substrate.

The semiconductor light emitting device may further include a dielectric layer formed between the reflective metal layer and the rear surface of the substrate and having a lower refractivity than that of the substrate.

The concavo-convex part may include: a first concavo-convex part formed on the top surface of the isolation region; and a second concavo-convex part formed on the bottom surface of the substrate.

The light emitting cell array used in the present invention may have various connections such as a series connection, a parallel connection, and a series-parallel connection. Accordingly, the connection part may be implemented in various types.

Each of the light emitting cells may include a plurality of groups divided by two or more light emitting cells. The connection part may include: a plurality of interconnection parts formed between the adjacent light emitting cells to connect the light emitting cells of the same group in series; at least one first connection part connected to the first-conductivity-type semiconductor layer of the light emitting cell located at one end of each of the groups; and at least one second connection part connected to the second-conductivity-type semiconductor layer of the light emitting cell located at the other end of each of the groups. The groups may have the same number of light emitting cells.

The connection part may include: at least one first connection part connected to the first-conductivity-type semiconductor layer of the light emitting cells; and at least one second connection part connected to the second-conductivity-type semiconductor layer of the light emitting cells.

According to another aspect of the present invention, there is provided a semiconductor light emitting device including: a substrate; a plurality of light emitting cells arrayed on the substrate, the light emitting cells each having a first-conductivity-type semiconductor layer, an active layer, and a second-conductivity-type semiconductor layer that are sequentially stacked on the substrate; a connection part formed to connect the light emitting cells in series, parallel or series-parallel; and a reflection member formed on an isolation region between the light emitting cells.

The isolation region may include a region exposing the substrate, and the reflection member may be formed in the exposed region of the substrate.

The isolation region may include a region exposing the first-conductivity-type semiconductor layer, and the reflection member may be formed in the exposed region of the first-conductivity-type semiconductor layer.

The reflection member may be a reflective metal layer formed to be electrically isolated from the connection part. The reflective metal layer may be formed in a region spaced apart from the connection part. The reflective metal layer may be formed on the connection part, with an insulation member therebetween.

The reflection member may include an insulative resin containing high-reflectivity powder. The high-reflectivity powder may include ceramic powder. For example, the high-reflectivity powder may be one selected from the group consisting of $TiO_2$, $Al_2O_3$, $MgO$, and a mixture thereof.

According to another aspect of the present invention, there is provided a semiconductor light emitting device including: a substrate; a plurality of light emitting cells each having a first-conductivity-type semiconductor layer, an active layer, and a second-conductivity-type semiconductor layer that are sequentially stacked on the top surface of the substrate, the light emitting cells being divided by an isolation region that is formed by removing at least the active layer; at least one first connection part and at least one second connection part formed to connect the light emitting cells in series, parallel or series-parallel, the first connection part being electrically connected to the first-conductivity-type light emitting layer of the light emitting cell, the second connection part being electrically connected to the second-conductivity-type light emitting layer of the light emitting cell; and at least one first bonding pad and at least one second bonding pad formed on a region adjacent to one edge of the top surface of the substrate or on a portion of a semiconductor multilayer structure that does not participate in emitting light, the first bonding pad being connected to the first connection part, the second bonding pad being connected to the second connection part.

The first connection part or the second connection part may be formed on the region of the top surface adjacent to the edge, in which the first bonding pad or the second bonding pad is formed.

The light emitting cells may have approximately the same active layer area. The light emitting cell may have a first-conductivity-type semiconductor exposing region wider than the first-conductivity-type semiconductor exposing region of another light emitting cell, and the first bonding pad may be formed on the first-conductivity-type semiconductor exposing region of the light emitting cell.

The second bonding pad may be formed in a region of the top surface of the substrate adjacent to one edge. The second bonding pad may be formed on a portion of a semiconductor multilayer structure that is located at one edge of the top surface of the substrate and does not participate in emitting light.

The first connection part or the second connection part may be formed in the region of the top surface adjacent to the edge, in which the second bonding pad is formed. The first bonding pad and the second bonding pad may be formed respectively in the regions opposing each other on the top surface of the substrate.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Figure 1:
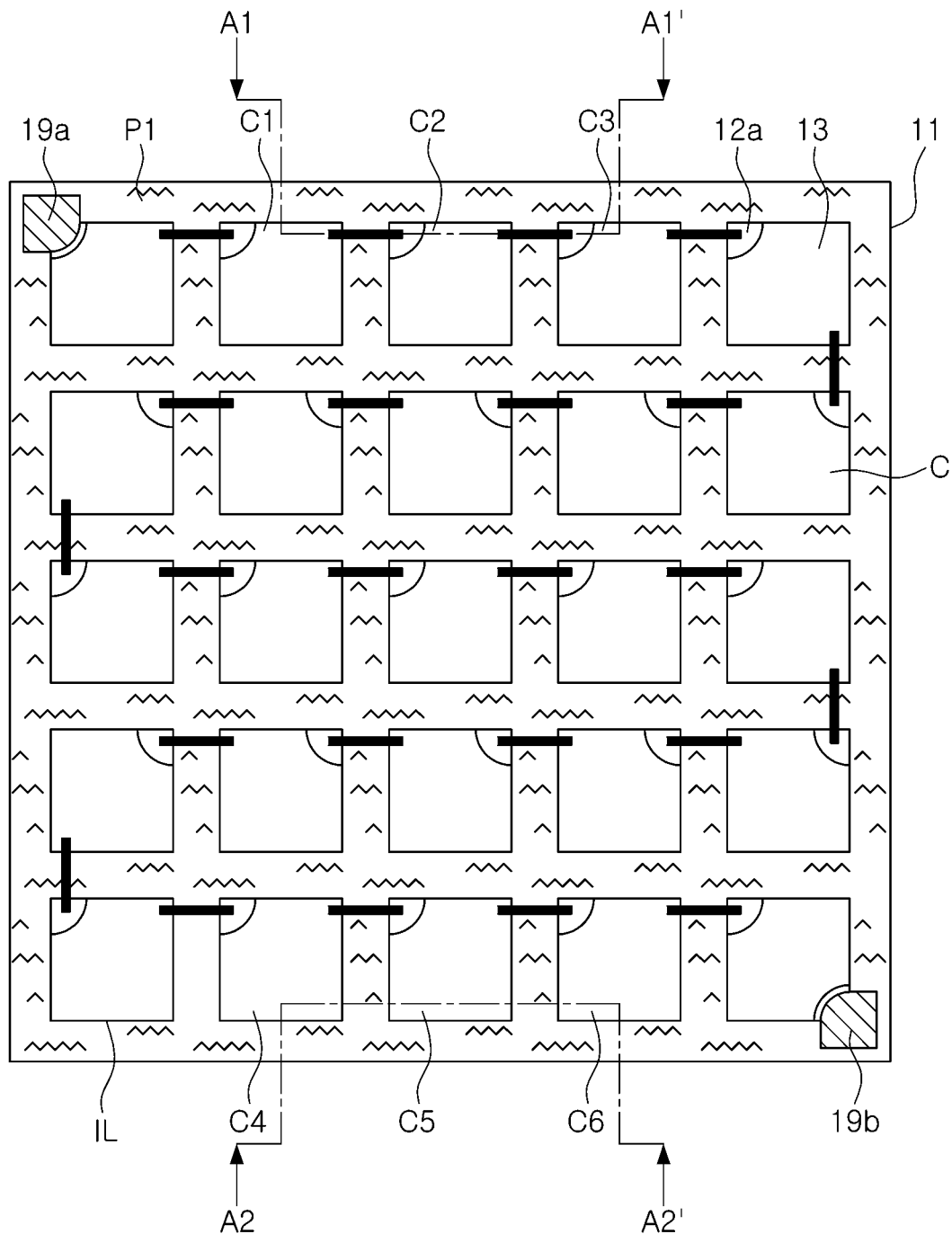
FIG. 1 is a plan view illustrating an example (a complete isolation between cells) of a multi-cell array semiconductor light emitting device according to a first embodiment of the present invention.

Exemplary embodiments of the present invention will now be described in detail with reference to the accompanying drawings. The invention may, however, be embodied in many different forms and should not be construed as being limited to the embodiments set forth herein. Rather, these embodiments are provided so that this disclosure will be thorough and complete, and will fully convey the scope of the invention to those skilled in the art. In the drawings, the thicknesses of layers and regions are exaggerated for clarity. Like reference numerals in the drawings denote like elements, and thus their description will be omitted.

Figure 2:
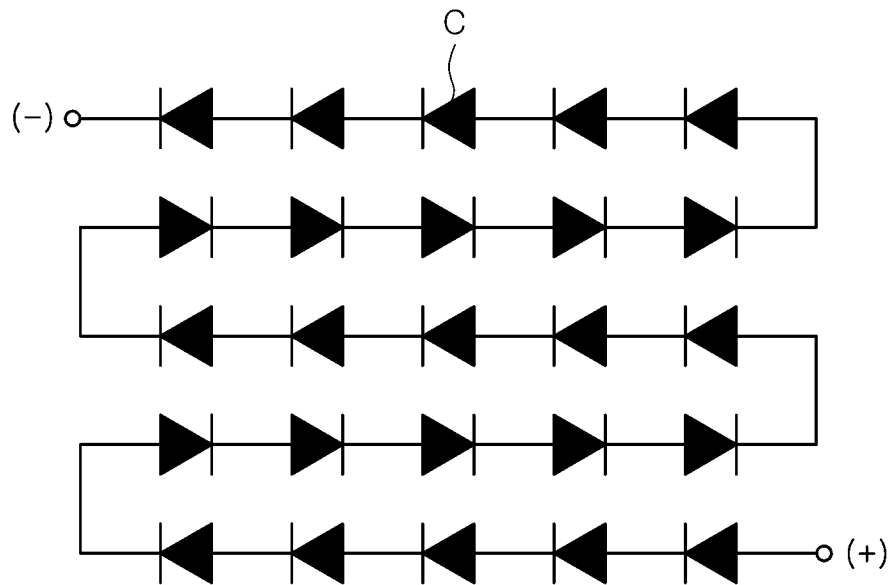
FIG. 2 is an equivalent circuit diagram of the multi-cell array semiconductor light emitting device illustrated in FIG. 1.
Figure 3A:
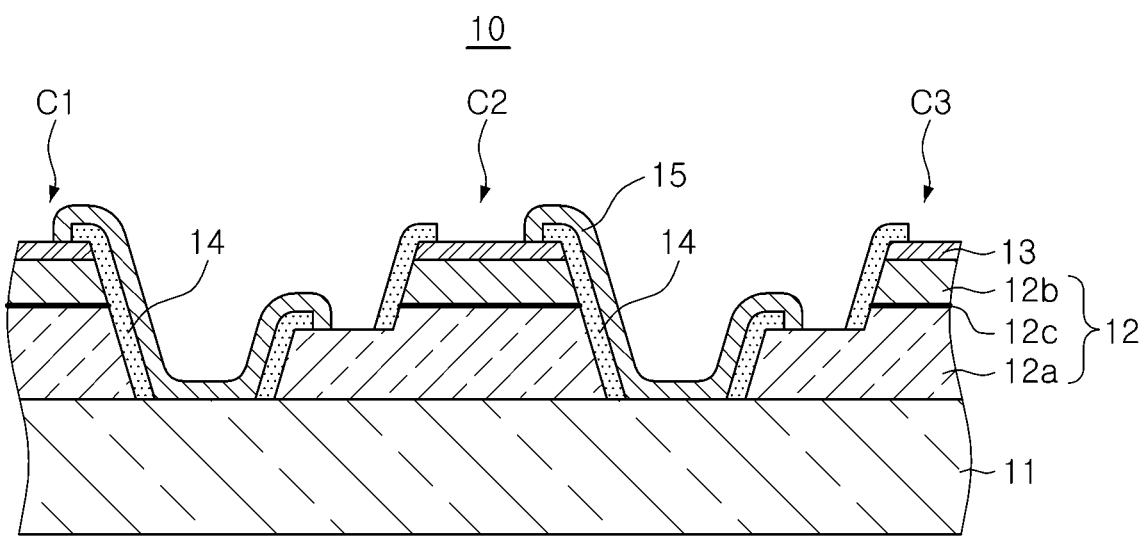
FIGS. 3A and 3B are side sectional views of the multi-cell array semiconductor light emitting device illustrated in FIG. 1, which are taken along lines A1-A1' and A2-A2' of FIG. 1.
Figure 3B:
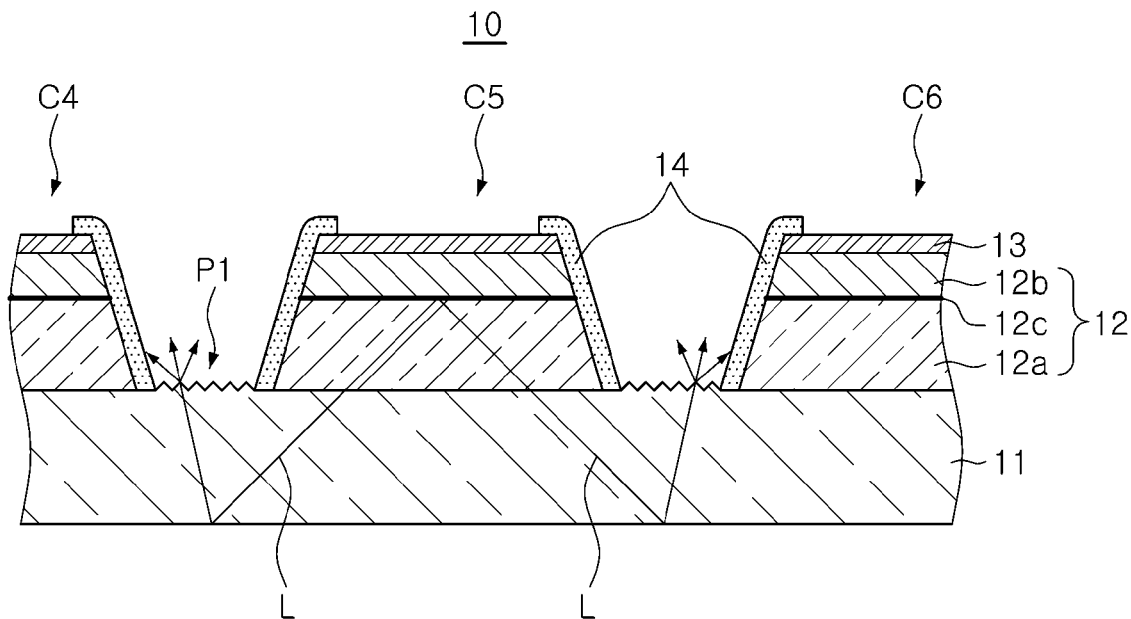

FIG. 1 is a plan view illustrating an example (a complete isolation between cells) of a multi-cell array semiconductor light emitting device according to a first embodiment of the present invention. FIG. 2 is an equivalent circuit diagram illustrating the connection between cells of the multi-cell array semiconductor light emitting device illustrated in FIG. 1. FIGS. 3A and 3B are side sectional views of the multi-cell array semiconductor light emitting device illustrated in FIG. 1, which are taken along lines A1-A1' and A2-A2' of FIG. 1.

Referring to FIGS. 1 and 3A, a multi-cell array semiconductor light emitting device 10 according to a first embodiment of the present invention includes a substrate 11, and a plurality of light emitting cells C arrayed on the top surface of the substrate 11.

The light emitting cell C is obtained by dividing, through an isolation process, a semiconductor multilayer structure 12 having a first-conductivity-type semiconductor layer 12a, an active layer 12c, and a second-conductivity-type semiconductor layer 12b that are sequentially stacked on the top surface of the substrate 11.

In this specification, the term 'light emitting cell' means a portion of a semiconductor multilayer structure having an active layer region differentiated from another cell. The term 'isolation region' means a region that is to form a cell by removing the semiconductor multilayer structure partially (e.g., partial isolation by a mesa etching process) or by removing the semiconductor multilayer structure until exposing the substrate (e.g., complete isolation by an isolation process), which includes a region defined between cells.

In this embodiment, an isolation process for forming a light emitting cell is an isolation process by isolation exposing up to the surface of the substrate 11 (hereinafter referred to as 'complete isolation'). That is, in an isolation region defined between the light emitting cells C, the semiconductor multilayer structure 12 may be entirely removed to expose the surface of the substrate 11, as illustrated in FIG. 1.

As illustrated in FIGS. 1, 3A and 3B, each of the light emitting cells C has a region in which the first-conductivity-type semiconductor layer 12a is partially exposed by a mesa etching process. A separate electrode may be formed in an exposed region of the second-conductivity-type semiconductor layer of each of the light emitting cells C. However, in this embodiment, power may be applied to each cell through a connection part that connects cells, without using a separate electrode.

A transparent electrode 13 may be formed on the top surface of the second-conductivity-type semiconductor layer 12b. Herein, the transparent electrode 13 may be formed of a transparent conductive material such as ITO and ZnO.

In this embodiment, the light emitting cells C are connected in series to form a line as illustrated in FIG. 2. A first bonding pad 19a and a second bonding pad 19b may be formed respectively on the light emitting cells located at both ends of the line.

For this series connection, a connection part 15 may be formed to connect the semiconductor layers of opposite conductivity types of the adjacent light emitting cells C (that is, the electrodes of opposite polarities).

Although not illustrated in FIG. 1, the series connection may be realized by connecting the electrodes of opposite polarities of the adjacent light emitting cells C1, C2 and C3, as illustrated in FIG. 2.

Also, in order to prevent a connection with an undesired region of the corresponding light emitting cell C, an insulation layer 14 may be formed on the side surface of the light emitting cell C. As illustrated in the drawings, the insulation layer 14 may be used as a passivation layer that is provided on almost the entire side surface of each of the light emitting cells C.

In this embodiment, as illustrated in FIG. 1, a concavo-convex portion P1 is formed on the surface of an isolation region defined as a region between the light emitting cells C. As described above, the isolation region of this embodiment is provided to the surface of the substrate 11.

Referring to FIG. 3B, a concavo-convex part P1 is formed on the surface of the substrate 11 exposed by the isolation region between the light emitting cells C4, C5 and C6. The concavo-convex part P1 serves to effectively extract light L, which may be wasted by being confined in the substrate 11 or by being emitted to the side of the substrate 11, in the upward direction (i.e., the effective emission direction).

In this embodiment, the concavo-convex part P1 may be formed through a wet etching process, a dry etching process, or an etching process using a well-known lithography process.

Although FIG. 1 illustrates that the concavo-convex part P1 is formed only in the isolation region in which the connection part 15 is not formed, the concavo-convex part P1 may also be formed in the region in which the connection part 15 is formed. Also, the concavo-convex part P1 may be formed not only in the surface belonging to the isolation region, but also in the region of the top surface adjacent to the edge of the substrate.

The process for forming the concavo-convex part may be performed in succession to the isolation process for forming the isolation region. However, according to another embodiment, the process for forming the concavo-convex part may be performed simultaneously in combination with the isolation process for forming the isolation region.

Unlike this, a substrate with a concavo-convex part formed on a top surface thereof may be used to provide a desired concavo-convex part in the isolation region. This will be described below in detail with reference to FIGS. 17 and 19.

In the above embodiment, an insulative substrate such as a sapphire substrate is used as the substrate 11. However, in other embodiments, the substrate 11 may be a conductive substrate that is a metal substrate such as GaN, SiC, and plating layers.

If a conductive substrate is used, an electrode for driving each light emitting cell may be connected by the conductive substrate and another electrode with the opposite polarity may be interconnected by forming an interconnection on the top surface of the cell.

Accordingly, the number of interconnection lines formed on the surface of the light emitting cells can be decreased, thus improving light extraction efficiency.

In the above semiconductor light emitting device, the concavo-convex part P1 is formed on the top surface of the substrate 11, that is, in the isolation region. However, a similar concavo-convex part may also be formed on the rear surface of the substrate to improve the light extraction efficiency thereof.

Figure 4A:
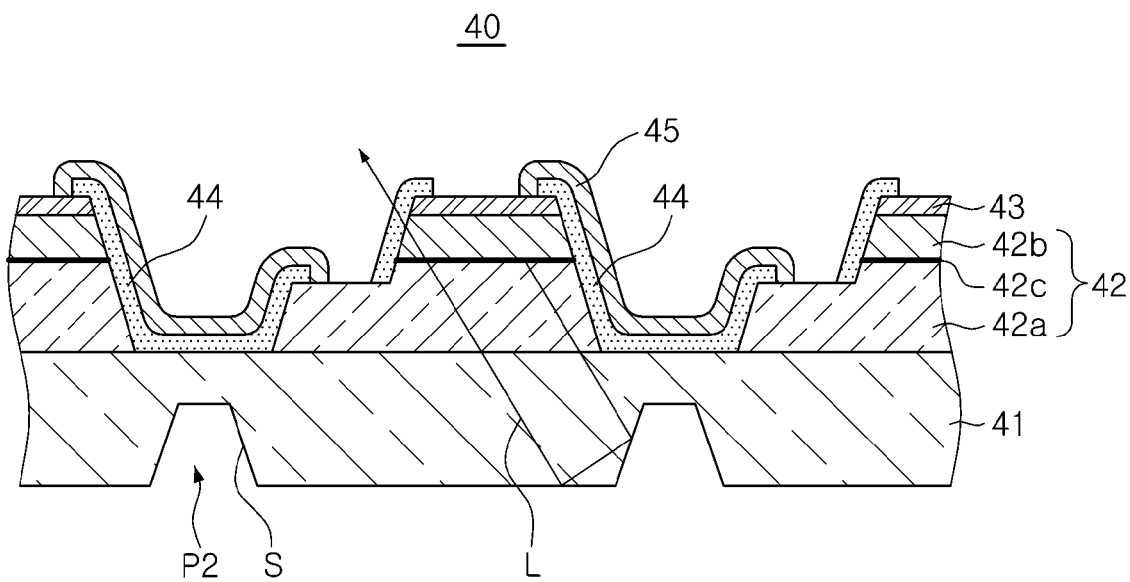
FIGS. 4A and 4B are cross-sectional views illustrating another example of a multi-cell array semiconductor light emitting device according to a first embodiment of the present invention.
Figure 4B:
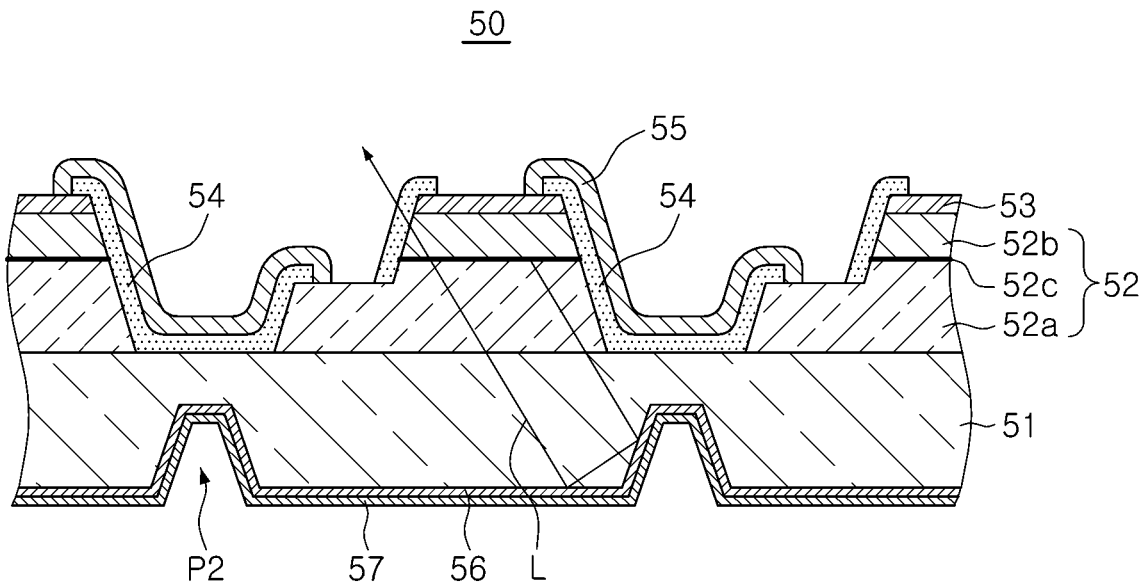

FIGS. 4A and 4B are cross-sectional views illustrating another example of a multi-cell array semiconductor light emitting device according to a first embodiment of the present invention.

FIGS. 4A and 4B illustrate another embodiment that improves the rear surface of the substrate. The array and connection of the light emitting cells in the semiconductor light emitting device illustrated in FIGS. 4A and 4B are similar to the array and connection of the light emitting cells in the semiconductor light emitting device illustrated in FIG. 1.

Referring to FIG. 4A, a semiconductor light emitting device 40 includes a substrate 41, and a light emitting cell having a semiconductor multi layer structure 42 formed on the substrate 41. The semiconductor multi layer structure 42 has a first-conductivity-type semiconductor layer 42a, an active layer 42c, and a second-conductivity-type semiconductor layer 42b that are sequentially stacked on the substrate 41.

In this embodiment, each of the light emitting cells may have a transparent electrode 43. The adjacent cells may be connected by a connection part 45. By an insulation layer 44, the connection part 45 can prevent an undesired connection with the side of the light emitting cell.

The substrate 41 may be a transparent substrate such as a sapphire substrate. A concavo-convex part P2 is applied to the rear surface of the substrate. If a light emission surface is the surface where the semiconductor multilayer structure 42 is formed, the concavo-convex part P2 applied to the rear surface of the substrate may be formed of a groove part having an inclined side sidewall S as illustrated in the drawings.

The inclined sidewall S can guide light L, which may be wasted by being confined in the substrate or by propagating to the side of the substrate, to the upward direction (i.e., the effective emission direction).

In this embodiment, the groove part may be formed in the region corresponding to the isolation region between the light emitting cells; however, the present invention is not limited thereto. Also, the size and interval of the groove part may be implemented in various types according to embodiments.

Referring to FIG. 4B, a semiconductor light emitting device 50 includes a substrate 51, and a light emitting cell having a semiconductor multi layer structure 52 formed on the substrate 51. The semiconductor multi layer structure 52 has a first-conductivity-type semiconductor layer 52a, an active layer 52c, and a second-conductivity-type semiconductor layer 52b that are sequentially stacked on the substrate 51.

In this embodiment, each of the light emitting cells may have a transparent electrode 53. The adjacent cells may be connected by a connection part 55. An insulation layer 54 may be formed between the connection part 55 and the side surface of the light emitting cell.

Like the embodiment illustrated in FIG. 4A, a concavo-convex part P2 is applied to the rear surface of the substrate 51. In this embodiment, an additional reflection structure is provided to the rear surface of the substrate. The additional reflection structure may include a reflective metal layer 57 and a dielectric layer 56 disposed between the reflective metal layer 57 and the substrate 51.

The reflective metal layer 57 may be a single-layer film formed of a material selected from the group consisting of Ag, Al, Rh, Cr, Pd, and Ni, may be a multilayer film such as Ti/Ag, Ti/Al, Ni/Ag, Ni/A, and Pt/Rh, or may be an alloy layer or an alloy-containing multilayer film such as AgAl, AlCuSi, Ni/AgAl, and Ti/AgCu.

The dielectric layer 56 may be formed of a material having a lower refractivity than that of the substrate 51. In this case, loss by absorption at the reflective metal layer 57 can be minimized, and the refractivity can be significantly improved in comparison with the case of using only the reflective metal layer 57.

Figure 5:
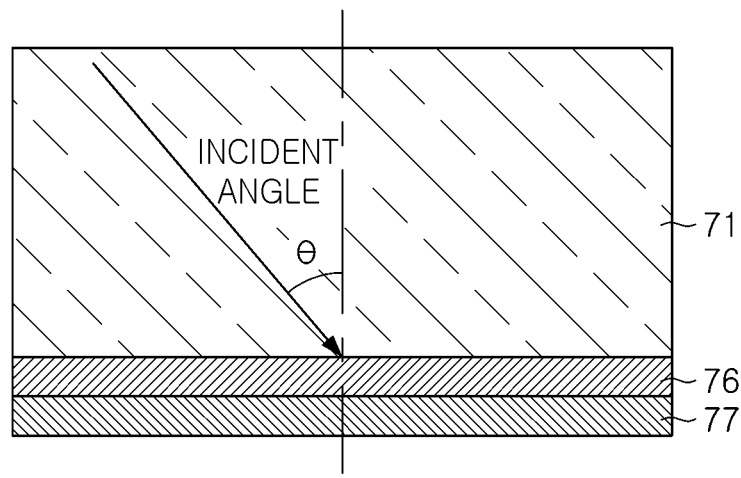
FIG. 5 is a schematic diagram illustrating exemplary conditions and effects of a reflection structure used in the multi-cell array semiconductor light emitting device illustrated in FIG. 4B.

FIG. 5 is a schematic diagram illustrating exemplary conditions and effects of a reflection structure used in the multi-cell array semiconductor light emitting device illustrated in FIG. 4B.

Referring to FIG. 5, a sapphire substrate 71 has a $SiO_2$ film 76 (i.e., a dielectric layer) and an Al reflective metal layer 77 that are sequentially formed on the bottom surface.

When the thickness of the Al reflective metal layer 77 is 2000 Å, a difference in reflectance depending on the thickness of the $SiO_2$ film 76 was measured.

Figure 6:
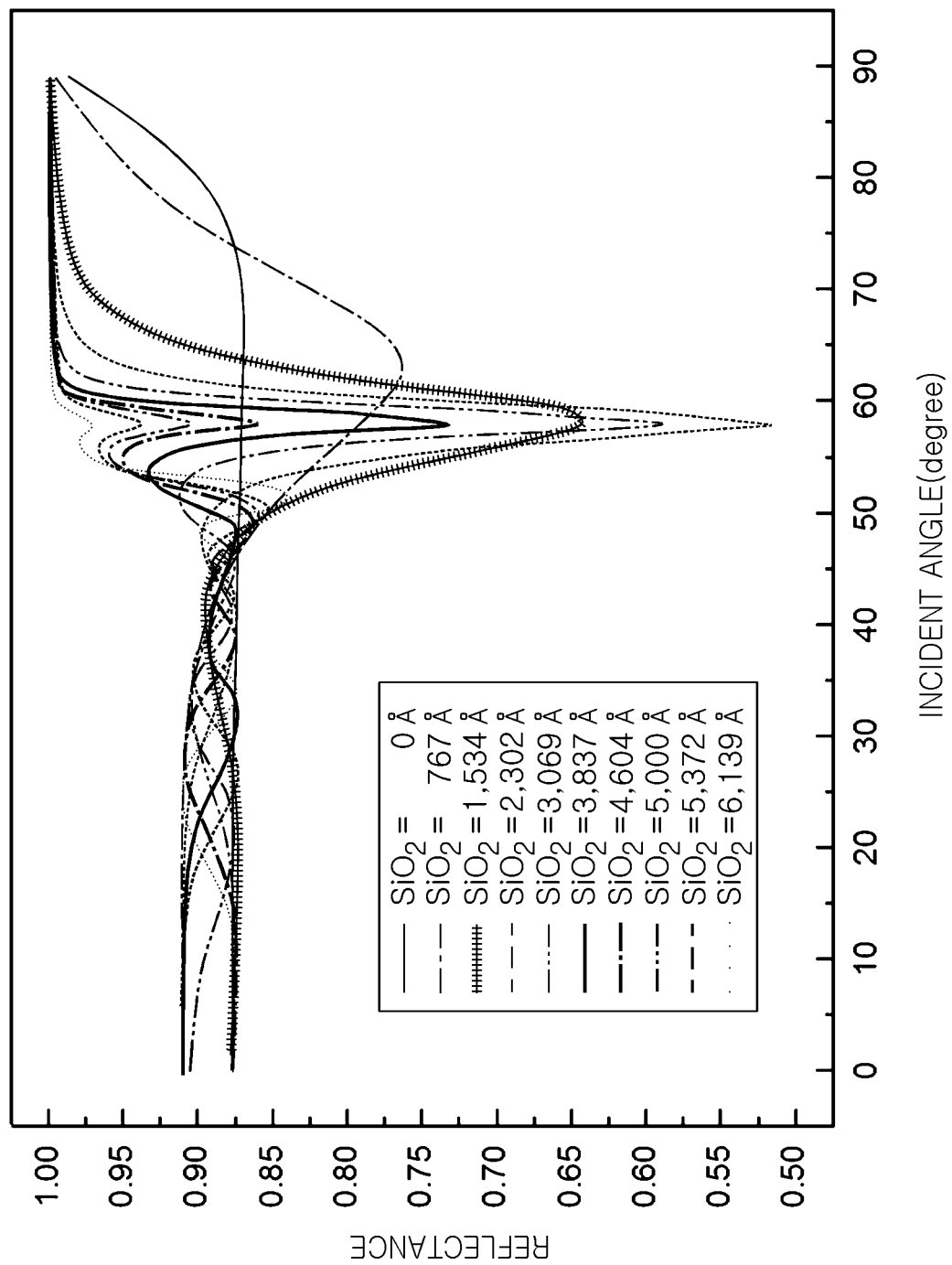
FIG. 6 is a graph illustrating a change of the reflectance depending on the incident angle in the reflection structure illustrated in FIG. 5.

FIG. 6 is a graph illustrating a change of the reflectance depending on the incident angle in the reflection structure illustrated in FIG. 5.

FIG. 6 illustrates a change of the reflectance depending on the incident angle of light under layer thickness conditions.

The average reflectance according to the thickness change of the $SiO_2$ film 76 was calculated on the basis of the reflectance depending on the incident angle illustrated in FIG. 6, and the results are shown in Table 1.

TABLE 1

| Thickness (Å) of $SiO_2$ Film | Average Reflectance (%) |
| --- | --- |
| No | 88.14 |
| 767 | 88.46 |
| 1,534 | 88.81 |
| 2,302 | 90.93 |
| 3,069 | 91.30 |
| 3,837 | 92.78 |
| 4,604 | 92.75 |
| 5,000 | 92.98 |
| 5,372 | 93.36 |
| 6,139 | 92.91 |

According to the experiment results, the dielectric layer disposed between the reflective metal layer and the substrate exhibits a reflectance of 90% or more when it has a thickness of about 2,000 Å or more. In the case of the sapphire substrate, if only aluminum is used for the reflective metal layer, the reflectance is about 88.14%. However, the reflectance can be improved by up to about 93.36% by interposing a $SiO_2$ film with a thickness of about 5,372 Å between the aluminum layer and the sapphire substrate.

Figure 7:
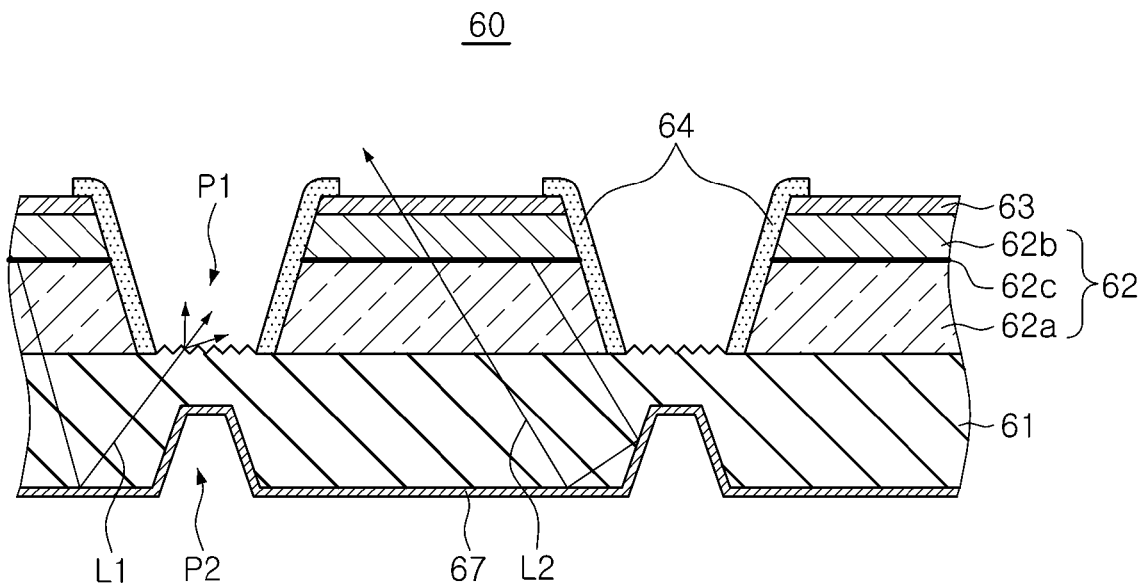
FIG. 7 is a cross-sectional view illustrating another example of a multi-cell array semiconductor light emitting device according to a first embodiment of the present invention.

FIG. 7 is a cross-sectional view illustrating another example of a multi-cell array semiconductor light emitting device according to a first embodiment of the present invention.

The embodiment illustrated in FIG. 7 corresponds to a combination of the concavo-convexo structure (including the reflection structure) of the aforesaid substrate rear surface and the concavo-convex part P1 disposed between the isolation regions illustrated in FIG. 1. The structure illustrated in FIG. 7 corresponds to region A2-A2' in FIG. 1.

Referring to FIG. 7, a semiconductor light emitting device 60 includes a substrate 61, and a light emitting cell having a semiconductor multi layer structure 62 formed on the substrate 61. The semiconductor multi layer structure 62 has a first-conductivity-type semiconductor layer 62a, an active layer 62c, and a second-conductivity-type semiconductor layer 62b that are sequentially stacked on the substrate 61.

In this embodiment, a concavo-convex part P1 is formed on the surface of the substrate 61 exposed by the isolation region between the light emitting cells. Also, a groove-shaped concavo-convex part P2 and a reflective metal layer 67 are formed on the rear surface of the substrate 61.

The reflective metal layer 67 may be a single-layer film formed of a material selected from the group consisting of Ag, Al, Rh, Cr, Pd, and Ni, may be a multilayer film such as Ti/Ag, Ti/Al, Ni/Ag, Ni/A, and Pt/Rh, or may be an alloy layer or an alloy-containing multilayer film such as AgAl, AlCuSi, Ni/AgAl, and Ti/AgCu.

As illustrated in FIG. 7, light L1 can be effectively extracted by being scattered by the concavo-convex part P1 provided in the isolation region of the cell, and L2 can be effectively guided to the effective upward direction by the reflective metal layer 67 and the concavo-convex part P2 formed on the rear surface of the substrate.

In this manner, the present invention effectively uses the isolation region and the rear surface of the substrate 61 to effectively extract light in a desired direction, thereby greatly improving the substantial light efficiency.

Figure 8A:
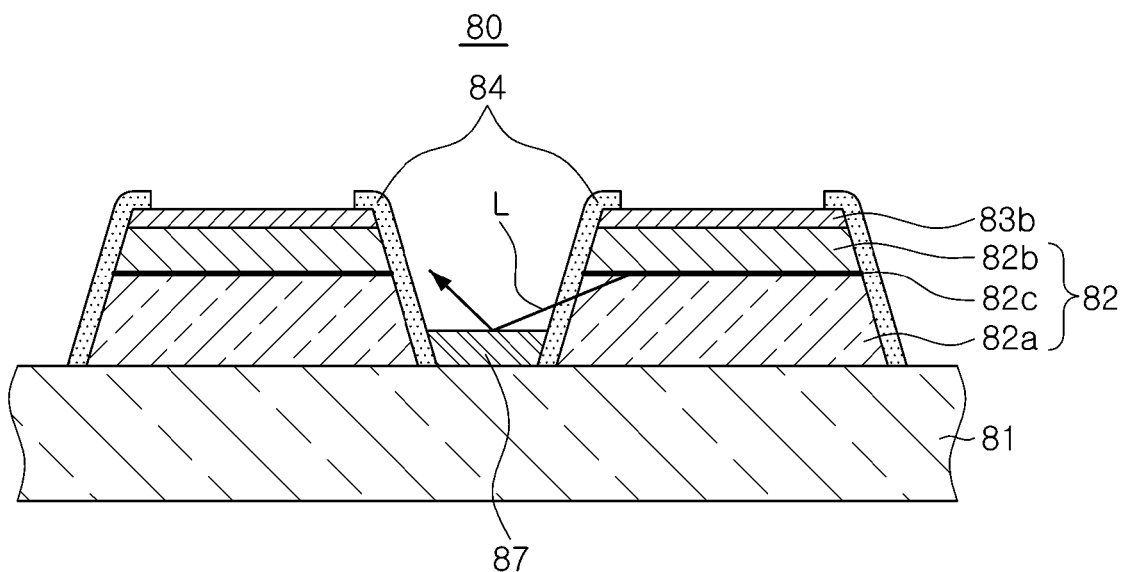
FIGS. 8A and 8B are cross-sectional views illustrating various examples (a complete isolation between cells) of a multi-cell array semiconductor light emitting device according to a second embodiment of the present invention.
Figure 8B:
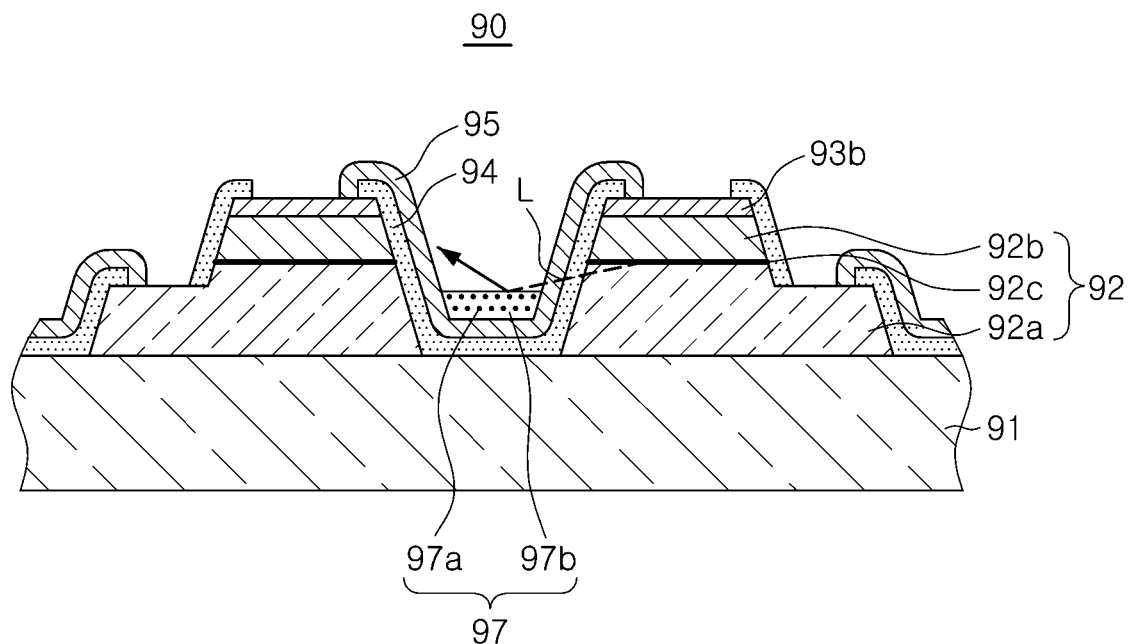

FIGS. 8A and 8B are cross-sectional views illustrating various examples (a complete isolation between cells) of a multi-cell array semiconductor light emitting device according to a second embodiment of the present invention.

Unlike the embodiment illustrated in FIGS. 3A and 3B, this embodiment provides a scheme for applying a reflection member to the isolation region.

The structure illustrated in FIG. 8A corresponds to the region of A2-A2' in the multi-cell array semiconductor light emitting device having a similar array to FIG. 1.

Referring to FIG. 8A, a semiconductor light emitting device 80 includes a substrate 81, and a light emitting cell having a semiconductor multilayer structure 82 formed on the substrate 81.

The semiconductor multilayer structure 82 has a first-conductivity-type semiconductor layer 82a, an active layer 82c, and a second-conductivity-type semiconductor layer 82b that are sequentially stacked on the substrate 81.

As illustrated in FIG. 8A, a reflection member may be provided in the isolation region between the light emitting cells. The reflection member may be a reflective metal layer 87. Although not illustrated in the drawings, the connection part connecting the cells may be formed of a reflective metal such as Al and Ag to contribute to the reflection efficiency improvement.

If a conductive reflection member such as a reflection metal layer 87 is used, it may be provided to prevent an undesired connection with the connection part.

For example, in this embodiment, it may be disposed at the location spaced apart from the connection part in order to secure the electrical isolation. In another exemplary embodiment, a reflective metal layer 87 may be provided after providing an additional insulation member on the connection part.

In this embodiment, the reflective metal layer 87 effectively emits light, which propagates to the isolation region between the light emitting cells, in the upward direction, thus contributing the reflection efficiency improvement.

In an embodiment using another light emission surface, for example, in a flip-chip structure where the rear surface of the substrate 81 is provided as a light emission surface, the reflective metal layer may greatly contribute to the light efficiency improvement.

Referring to FIG. 8B, a semiconductor light emitting device 90 includes a substrate 91 and a light emitting cell having a first-conductivity-type semiconductor layer 92a, an active layer 92c, and a second-conductivity-type semiconductor layer 92b that are sequentially stacked on the substrate 91.

Unlike the above embodiment, this embodiment includes a connection part 95 connecting the same-conductivity-type semiconductor layers 92b of the adjacent cells. This connection type may be used in the parallel connection structure.

As illustrated in FIG. 8B, a reflection member 97 is provided in the isolation region between the light emitting cells. The reflection member 97 includes a resin 97b with high-reflectance powder 97a scattered therein.

The high-reflectance powder 97a may be formed of a ceramic material such as $TiO_2$, $Al_2O_3$, MgO, and a mixture thereof. Also, the resin 97b may be an insulative resin.

If the reflection member 97 is implemented using an insulation member, the reflection member 97 may directly contact the connection part 95. Therefore, it may be provided throughout the isolation region between the light emitting cells, regardless of the location of the connection part 95.

In the aforesaid embodiment, the semiconductor multilayer structure is completed removed to expose the surface of the substrate (i.e., the completion isolation between the cells); however, the present invention is not limited thereto. The first-conductivity-type semiconductor layers between the cells may be shared by partial isolation (e.g., mesa etching). In this case, the concavo-convex part P1 of the first embodiment may also be applicable.

Figure 9:
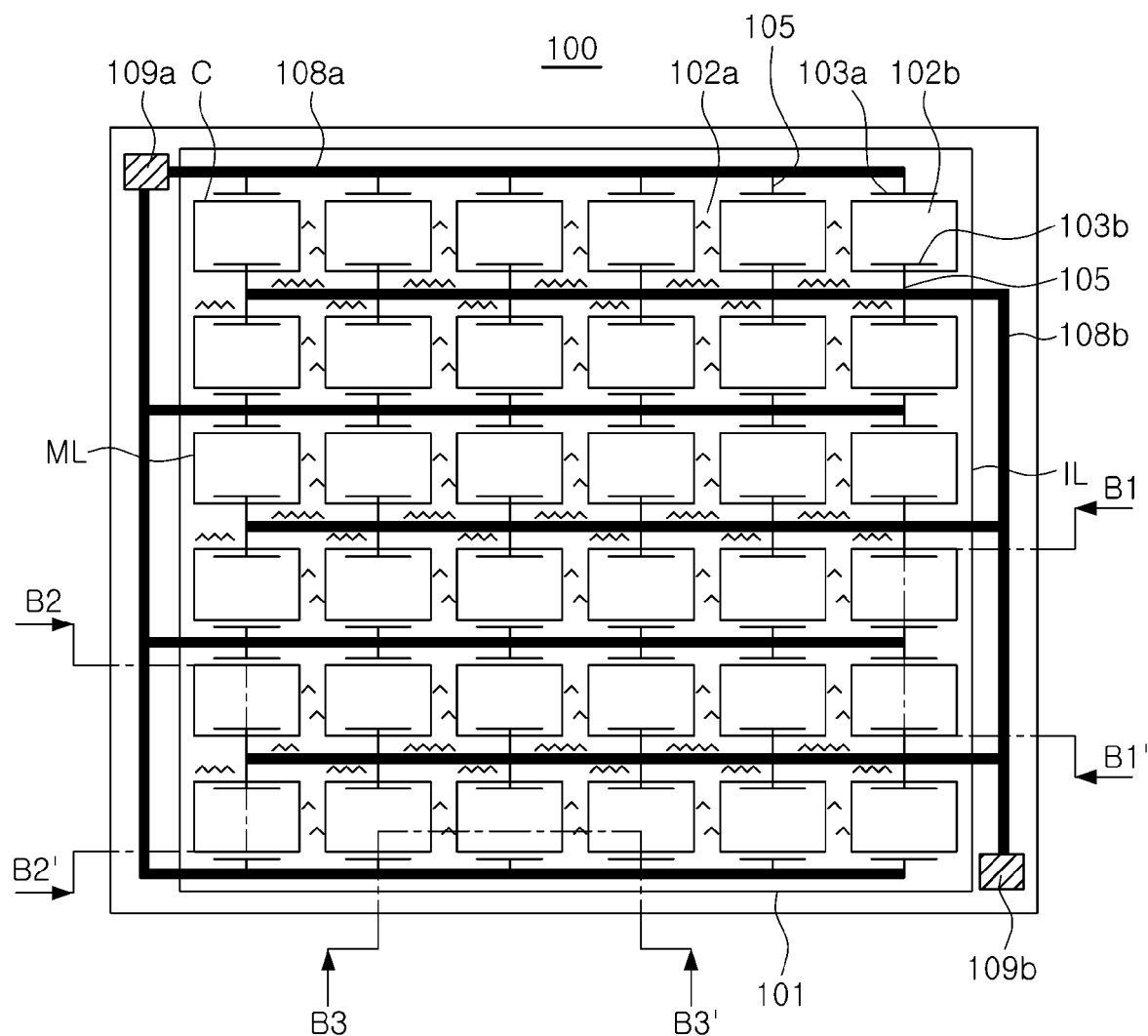
FIG. 9 is a plan view illustrating another example (a partial isolation between cells) of a multi-cell array semiconductor light emitting device according to a first embodiment of the present invention.
Figure 10:
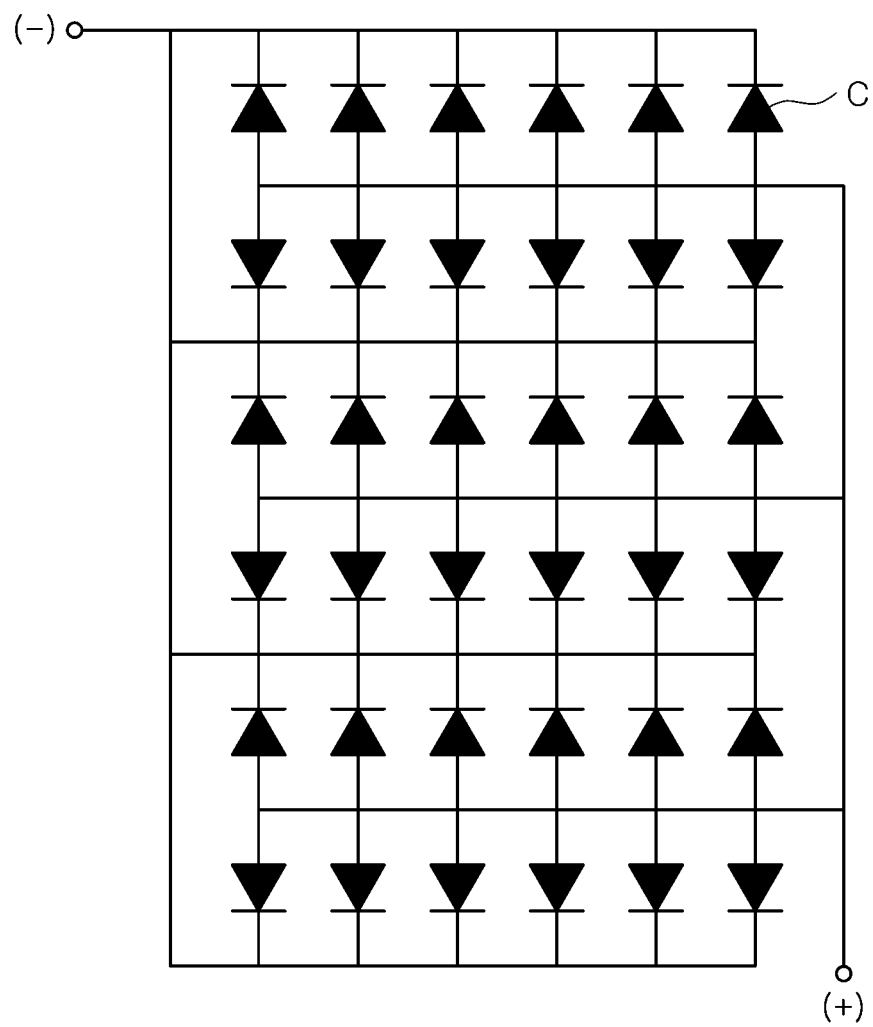
FIG. 10 is an equivalent circuit diagram of the multi-cell array semiconductor light emitting device illustrated in FIG. 9.

FIG. 9 is a plan view illustrating another example (a partial isolation between cells) of a multi-cell array semiconductor light emitting device according to a first embodiment of the present invention. FIG. 10 is an equivalent circuit diagram illustrating the connection between cells of the multi-cell array semiconductor light emitting device illustrated in FIG. 9.

Figure 11A:
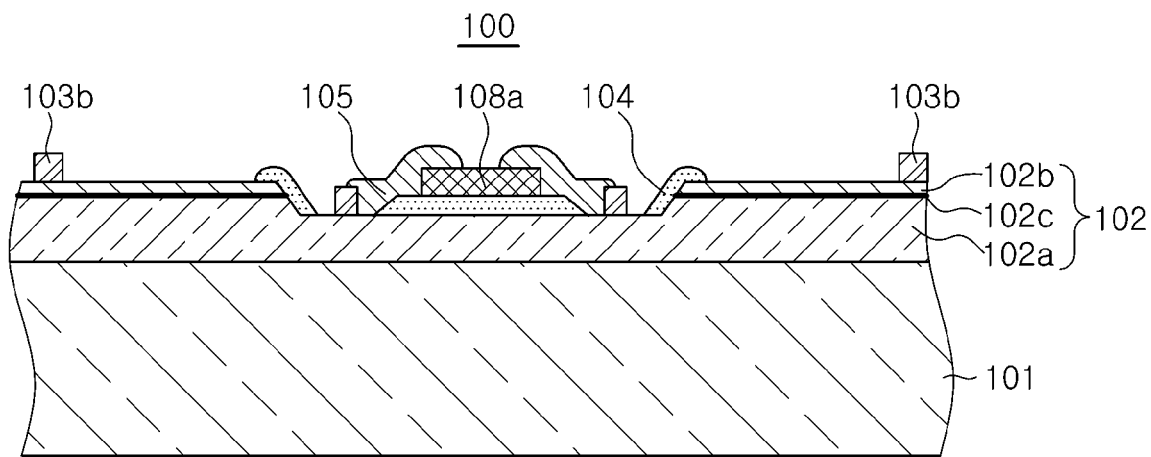
FIGS. 11A, 11B and 11C are side sectional views of the multi-cell array semiconductor light emitting device illustrated in FIG. 9, which are taken along lines B1-B1', B2-B2' and B3-B3' of FIG. 9.
Figure 11B:
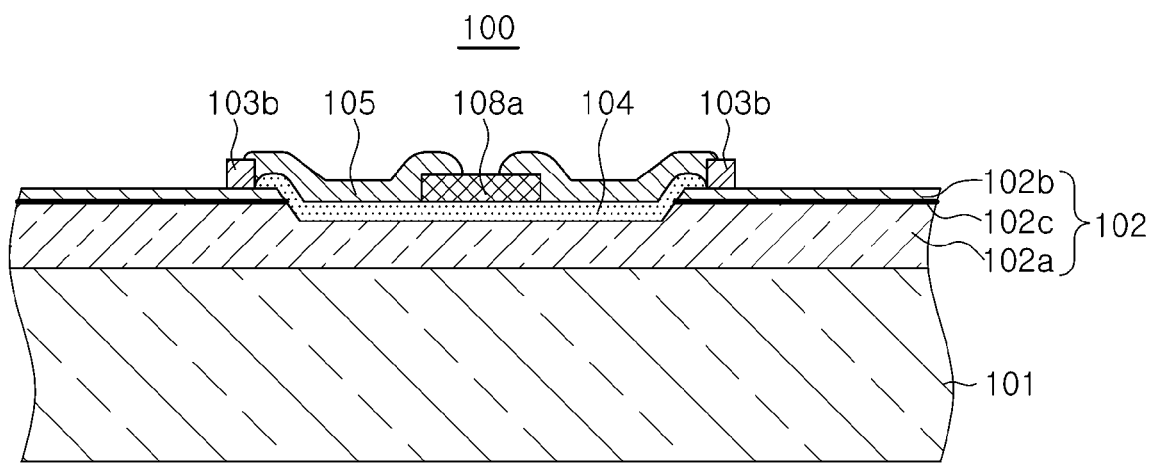
Figure 11C:
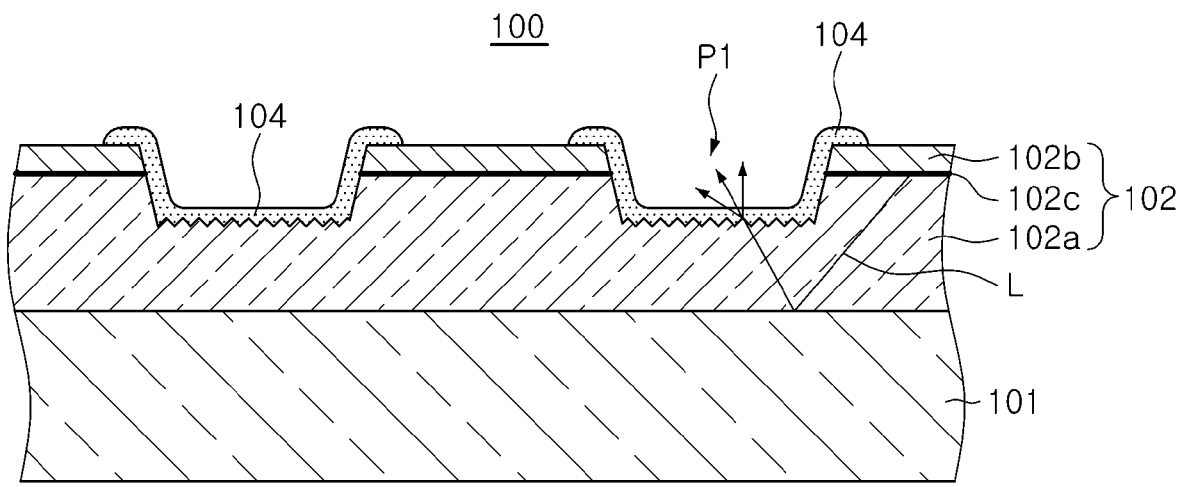

FIGS. 11A, 11B and 11C are side sectional views of the multi-cell array semiconductor light emitting device illustrated in FIG. 9, which are taken along lines B1-B1', B2-B2' and B3-B3' of FIG. 9.

Referring to FIGS. 9, 11A and 11B, a multi-cell array semiconductor light emitting device 100 includes a substrate 101, and a plurality of light emitting cells C arrayed in a 6×6 pattern on the top surface of the substrate 101.

The light emitting cell C is obtained by dividing a semiconductor multilayer structure 102 having a first-conductivity-type semiconductor layer 102a, an active layer 102c, and a second-conductivity-type semiconductor layer 102b that are sequentially formed on the top surface of the substrate 101.

In this embodiment, the semiconductor multilayer structure 102 is completely removed to expose the substrate in order to prepare the region for forming pads 109a and 109b on the top surface adjacent to the edge, and the first-conductivity-type semiconductor layer 102b is exposed through a partial isolation process (i.e., a mesa etching process) to isolate the light emitting cells.

The cell isolation by the mesa etching process may be used according to a desired connection method. That is, it may be suitably applied to a circuit capable of sharing the first-conductivity-type semiconductor layer 102a and a line disposed thereon and corresponding to a first polarity.

As illustrated in FIG. 9, the line obtained by the complete isolation process of FIG. 1 is represented by 'IL', and the line obtained by the partial isolation process (i.e., the mesa etching process) is represented by 'ML'.

In this embodiment, as illustrated in FIGS. 9, 11A and 11B, first and second electrodes 103a and 103b may be respectively formed on the exposed top surface of the first-conductivity-type semiconductor layer and the top surface of the second-conductivity-type semiconductor layer 102b. The first and second electrodes 103a and 103b have a linear shape, and they are arranged in parallel at regular intervals for uniform current distribution over the entire area.

In this embodiment, the connection part includes first and second connection parts 108a and 108b and an interconnection part 105 in order to connect all of the light emitting cells in parallel, as illustrated in FIG. 10. The first and second connection parts 108a and 108b may extend respectively from the first and second pads 109a and 109b, and may be respectively connected by the interconnection part 105 to the first and second electrodes 103a and 103b.

As illustrated in FIGS. 11A and 11B, the first and second connection parts 108a and 108b and the interconnection part 105 may be formed on the insulation layer 104 in order to prevent an undesired connection with the light emitting cell C.

The first and second electrodes 103a and 103b, the first and second connection parts 108a and 108b, and the interconnection part 105 may be formed of different electrode materials through different processes; however, the present invention is not limited thereto. For example, the first and second electrodes 103a and 103b, the first and second connection parts 108a and 108b, and the interconnection part 105 may be formed of the same electrode material through one process. That is, the first and second electrodes 103a and 103b may be formed in the same shape as the connection unit without using a separate electrode for each cell.

However, in this embodiment, in order to provide a uniform current distribution over all of the light emitting cells to improve the efficiency thereof, it may be arranged in parallel to the first connection part 108a like the second electrode 103b. In this embodiment, the first and second connection parts 108a and 108b are disposed between the light emitting cells of the adjacent columns, thereby simplifying the interconnection structure.

As illustrated in FIGS. 9 and 11, a concavo-convex part P1 may be formed on the surface of the first-conductivity-type semiconductor layer 102b obtained through a mesa etching process. The concavo-convex part P1 may be formed through a mesa etching process and a separate etching process or an additional lithography process; however, the present invention is not limited thereto.

In this embodiment, the concavo-convex part P1 can effectively extract light L, which may be wasted by being confined in the substrate 101 and the remaining first-conductivity-type semiconductor layer 102a or by being emitted to the side surfaces thereof, in the upward direction.

In the semiconductor light emitting device 100 of FIG. 9, the first and second bonding pads 109a and 109b connected to the first and second connection parts 108a and 108b are disposed in the region cleared of the semiconductor multilayer structure 102.

In this manner, without being formed directly with the cell, the pad is formed in the region cleared of the semiconductor multilayer structure 102, thereby providing a relatively uniform current to the directly connected light emitting cell C. Accordingly, the current concentration is prevented, thereby improving the light efficiency thereof.

Specifically, the region for the pads 109a and 109b are formed in the adjacent edge region where the first and second connection parts 108a and 108b are formed. That is, in order to form the first and second connection parts 108a and 108b, the semiconductor multilayer region not participating in light emission is used to dispose the first and second bonding pads 109a and 109b. Accordingly, it does not greatly affect the total effective light emission area versus the substrate area.

In this way, the structure and location of the pad are improved to improve the current distribution efficiency, thereby improving the light efficiency. This embodiment will be described below in detail with reference to FIG. 12.

Figure 12:
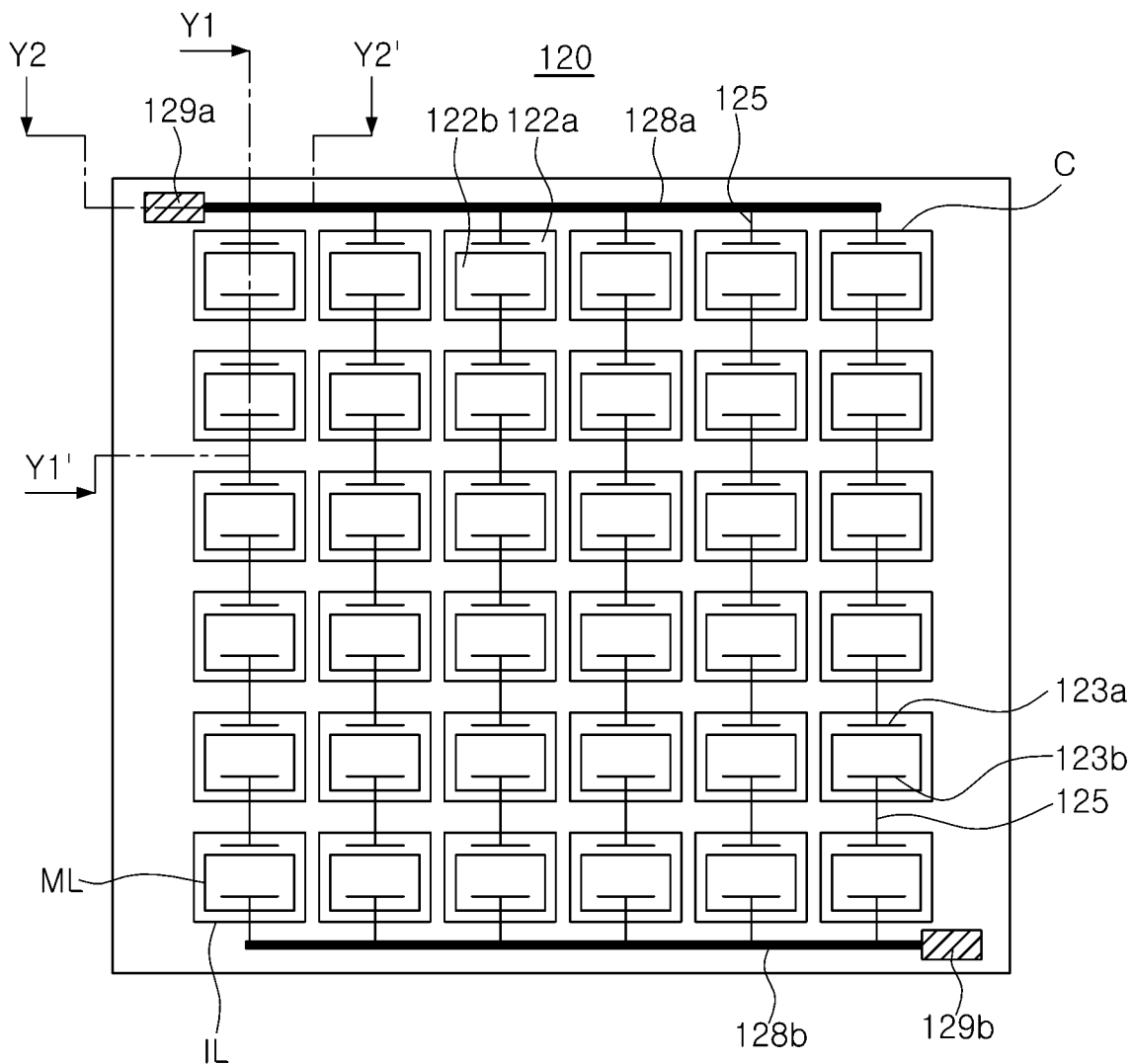
FIG. 12 is a plan view illustrating an example of a multi-cell array semiconductor light emitting device according to a third embodiment of the present invention.
Figure 13:
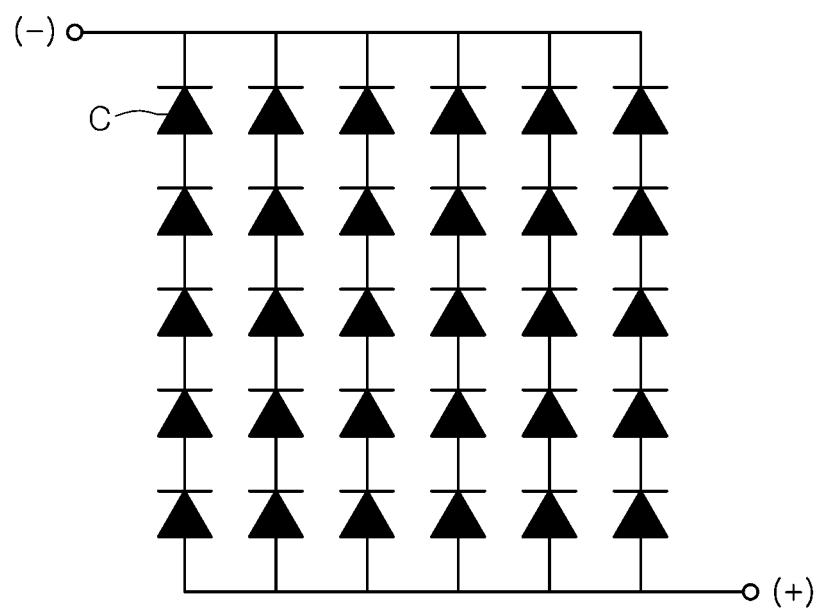
FIG. 13 is an equivalent circuit diagram of the multi-cell array semiconductor light emitting device illustrated in FIG. 12.

FIG. 12 is a plan view illustrating an example of a multi-cell array semiconductor light emitting device according to a third embodiment of the present invention. FIG. 13 is an equivalent circuit diagram of the multi-cell array semiconductor light emitting device illustrated in FIG. 12.

Referring to FIG. 12, a multi-cell array semiconductor light emitting device 120 includes a substrate 121, and a plurality of light emitting cells C arrayed in a 6×6 pattern on the top surface of the substrate 121.

The light emitting cell C is obtained by dividing a semiconductor multilayer structure 122 having a first-conductivity-type semiconductor layer 122a, an active layer 122c, and a second-conductivity-type semiconductor layer 122b that are sequentially formed on the top surface of the substrate 121.

In this embodiment, the isolation process is performed through a complete isolation process that completely removes the semiconductor multilayer structure 122 to expose the surface of the substrate 121. Also, the first-conductivity-type semiconductor layer 122a may be exposed through a partial isolation process (e.g., a mesa etching process). First and second electrodes 123a and 123b may be formed on the first-conductivity-type semiconductor layer 122a and the second-conductivity-type semiconductor layer 122b of each of the cells. The first and second electrodes 123a and 123b may be arranged in parallel at regular intervals to provide a uniform current distribution over the cell.

When six light emitting cells C belonging to each column constitute each group as illustrated in FIG. 12, the LED cells of each group are connected in series to each other and the groups are connected in parallel to each other, as illustrated in FIG. 13.

In this connection structure, the number of light emitting cells connected in series to each other may be selected according to the voltage standards. That is, the number of light emitting cells connected in series to each other in each cell is determined to satisfy desired voltage standards, and the number of groups connected in parallel to each other is controlled to provide a desired output. In this case, the groups may have the same number of light emitting cells.

In this embodiment, the connection part may include: a plurality of interconnection parts 125 formed between the adjacent light emitting cells to connect the light emitting cells C of the same group in series to each other; at least one first connection part 128a connected to the first-conductivity-type semiconductor layer 122a of the light emitting cell located at one end of each group; and at least one second connection part 128*b* connected to the second-conductivity-type semiconductor layer 122*b* of the light emitting cell located at the other end of each group.

In this embodiment, the first and second connection parts 128*a* and 128*b* are connected through the interconnection part 125 to the first and second electrodes 123*a* and 123*b* of the light emitting cell; however, the present invention is not limited thereto. In other embodiments, without forming a separate electrode in each cell, it may be connected to the desired-conductivity-type semiconductor layer of the light emitting cell through an interconnection line such as an interconnection part.

Figure 14A:
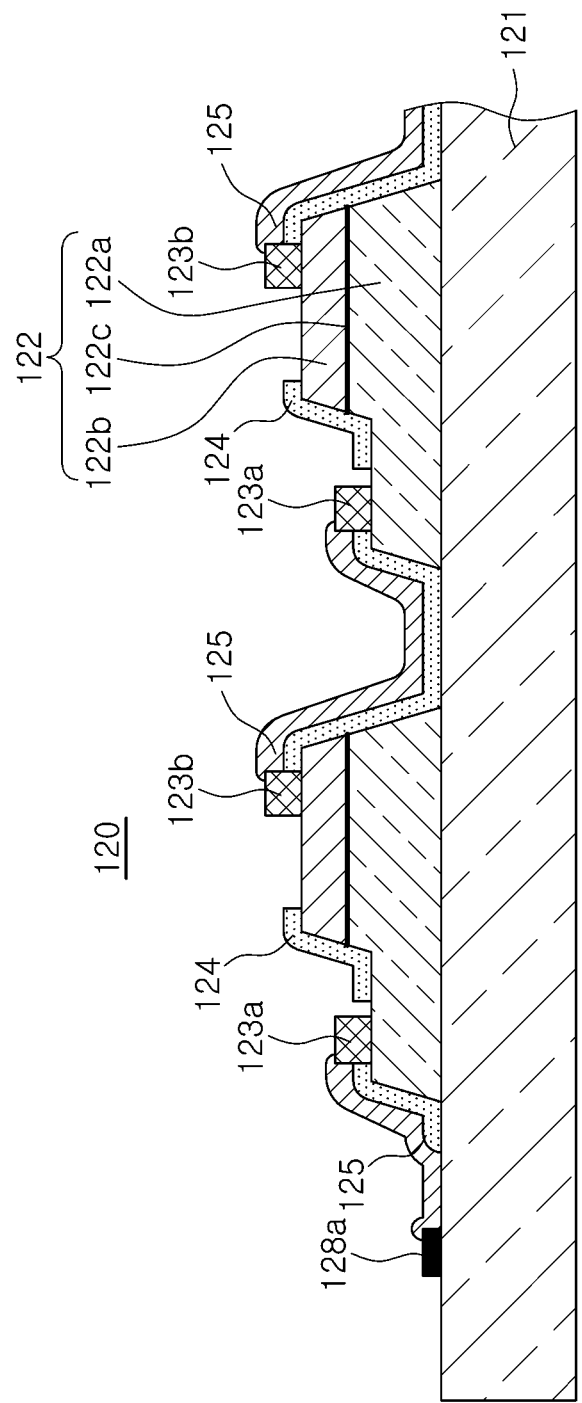
FIGS. 14A and 14B are side sectional views of the multi-cell array semiconductor light emitting device illustrated in FIG. 12, which are taken along lines Y1-Y1' and Y2-Y2' of FIG. 12.
Figure 14B:
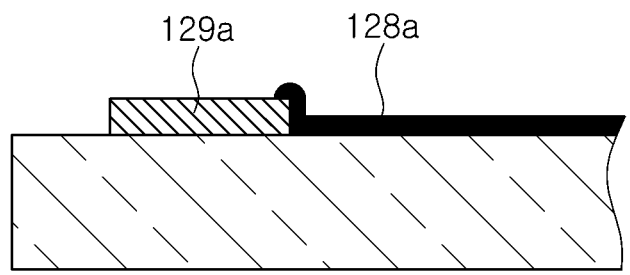

FIGS. 14A and 14B are side sectional views of the multi-cell array semiconductor light emitting device illustrated in FIG. 12, which are taken along lines Y1-Y1' and Y2-Y2' of FIG. 12.

Referring to FIGS. 14A and 14B, the first and second bonding pads 129*a* and 129*b* connected to the first and second connection parts 128*a* and 128*b* are disposed in the region cleared of the semiconductor multilayer structure 122.

In this manner, without being formed directly with the cell, the bonding pads 129*a* and 129*b* are formed in the region cleared of the semiconductor multilayer structure 122, thereby providing a relatively uniform current to the directly connected light emitting cell C. Accordingly, the current concentration is prevented, thereby improving the light efficiency.

Specifically, the region for the bonding pads 129*a* and 129*b* are formed in the adjacent edge region where the first and second connection parts 128*a* and 128*b* are formed. That is, in order to form the first and second connection parts 128*a* and 128*b*, the semiconductor multilayer region not participating in light emission is used to dispose the first and second bonding pads 129*a* and 129*b*. Accordingly, it does not greatly affect the total effective light emission area versus the substrate area.

In this embodiment, the bonding pads 129*a* and 129*b* are formed of a different material than the first and second connection parts 128*a* and 128*b* and the interconnection part 125. For example, the bonding pads 129*a* and 129*b* may be formed of a metal layer such as Cr/Au, and the first and second connection parts 128*a* and 128*b* and the interconnection part 125 may be formed of a high-reflectivity, high-conductivity metal material such as Al or Ag.

In other embodiments, the bonding pads 129*a* and 129*b*, the first and second connection parts 128*a* and 128*b*, and the interconnection part 125 may be formed of the same metal through a single pattern forming process. For example, the bonding pads 129*a* and 129*b*, the first and second connection parts 128*a* and 128*b*, and the interconnection part 125 may be formed of Cr/Au.

Unlike this embodiment, because it is necessary to dispose the pad forming location not to connect it directly to the light emitting cell that is the semiconductor multilayer structure participating in light emission, the pad may be disposed on another isolated semiconductor multilayer structure.

Figure 15:
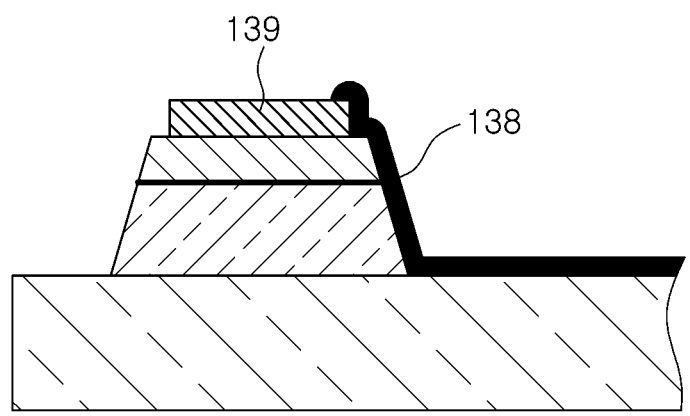
FIG. 15 is a side sectional view illustrating another example of a multi-cell array semiconductor light emitting device according to a third embodiment of the present invention.

FIG. 15 is a side sectional view illustrating another example of a multi-cell array semiconductor light emitting device according to a third embodiment of the present invention.

The structure illustrated in FIG. 15 represents the section of the portion corresponding to Y2-Y2' in the structure similar to the structure illustrated in FIG. 14.

As illustrated in FIG. 15, in this embodiment, a region of a bonding pad 139 is not provided in the region cleared of a semiconductor multi layer structure 132, but may be formed on the semiconductor multilayer structure not participating in light emission. In this case, because it is not directly formed on the light emitting cell, the problem of a current concentration can be prevented.

Figure 16:
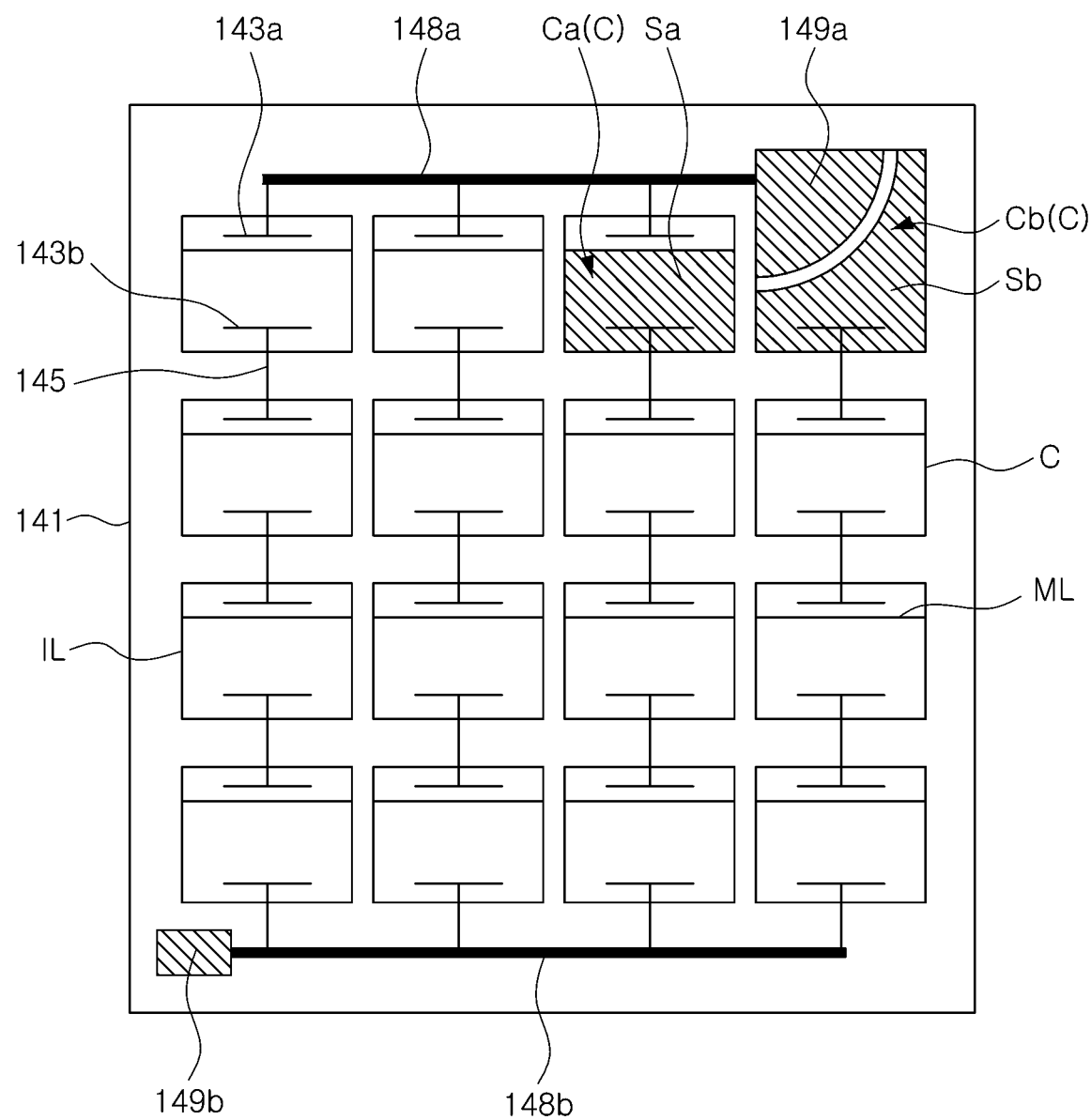
FIG. 16 is a plan view illustrating another example of a multi-cell array semiconductor light emitting device according to a third embodiment of the present invention.

FIG. 16 is a plan view illustrating another example of a multi-cell array semiconductor light emitting device according to a third embodiment of the present invention.

Referring to FIG. 16, a multi-cell array semiconductor light emitting device 140 includes a substrate 141, and a plurality of light emitting cells arrayed in a 4×4 pattern on the top surface of the substrate 141.

In this embodiment, an isolation region of the light emitting cell is provided as a region obtained by completely removing a semiconductor multilayer structure to expose the surface of the substrate 141. Also, the first-conductivity-type semiconductor layer may be exposed through a partial isolation process (e.g., a mesa etching process). First and second electrodes 143*a* and 143*b* may be formed on the first-conductivity-type semiconductor layer 142*a* and the second-conductivity-type semiconductor layer 142*b* of each of the cells.

The series-parallel connection structure of this embodiment is similar to that of the embodiment of FIG. 8, which connects four light emitting cells C in series in each group. In this embodiment, the connection part may include: a plurality of interconnection parts 125 formed between the adjacent light emitting cells to connect the light emitting cells C of the same group in series to each other; at least one first connection part 148*a* connected to the first-conductivity-type semiconductor layer 142*a* of the light emitting cell located at one end of each group; and at least one second connection part 148*b* connected to the second-conductivity-type semiconductor layer 142*b* of the light emitting cell located at the other end of each group.

In this embodiment, the light emitting cells used in the semiconductor light emitting device may have the same effective light emission area in order to prevent a current concentration on one of the cells. The effective light emission area is determined by the area of the active layer participating in light emission.

In this embodiment, even if the mesa etching area is increased to form the first bonding pad 149*a*, the light emitting cell Cb located at one edge is formed to be wider than another light emitting cell Ca, so that it can have substantially the same light emission area (Sb) as the light emission area (Sa) of another light emitting cell.

As illustrated in the drawings, because the second bonding pad 149*b* inevitably covers the light emission area, it may be formed on the region of the top surface of the substrate cleared of the semiconductor multilayer structure, or on the region of the semiconductor multilayer structure isolated from the light emitting cell.

Figure 17:
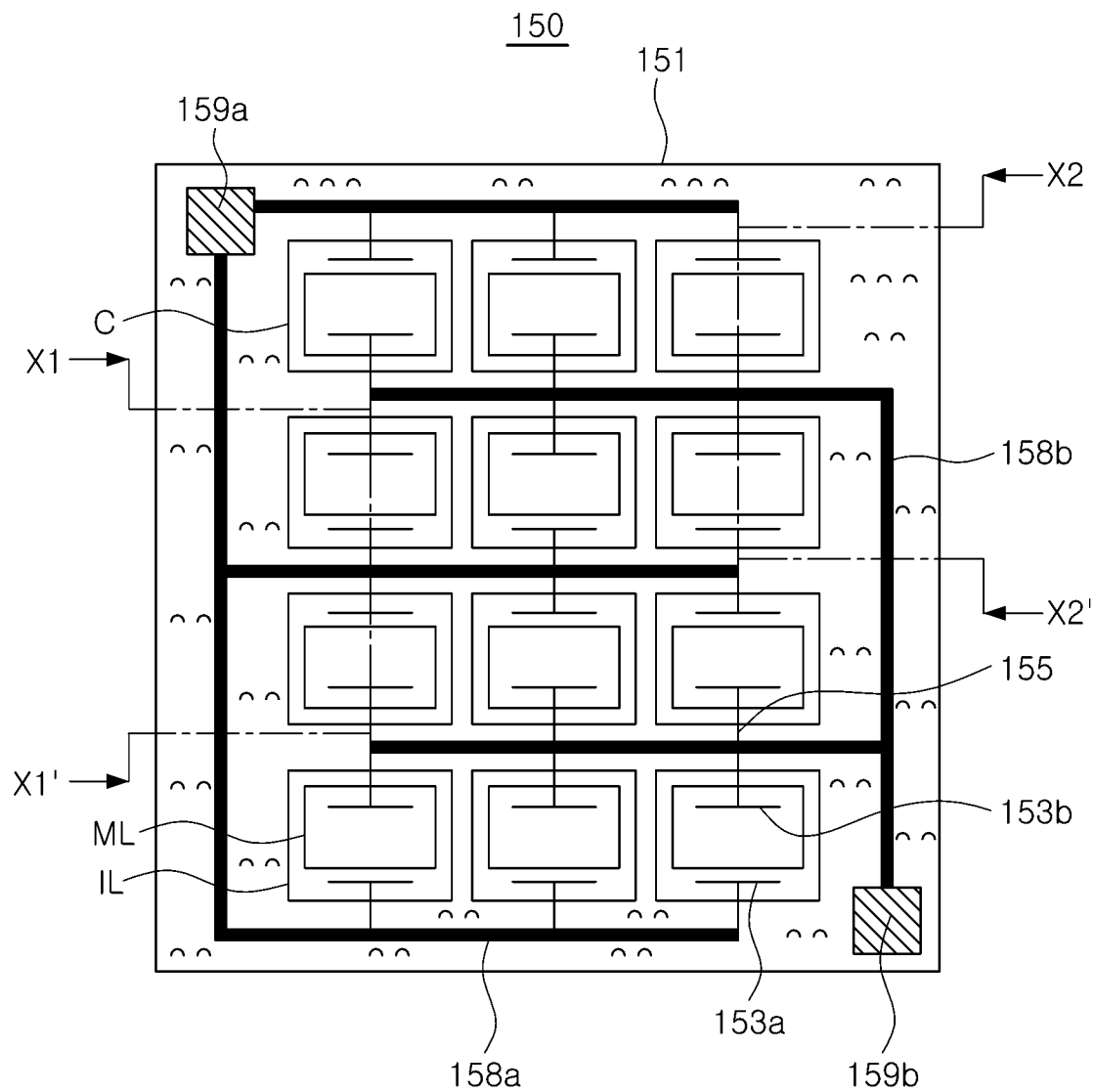
FIG. 17 is a plan view illustrating another example (a combination of a concavo-convex part) of a multi-cell array semiconductor light emitting device according to a third embodiment of the present invention.
Figure 18:
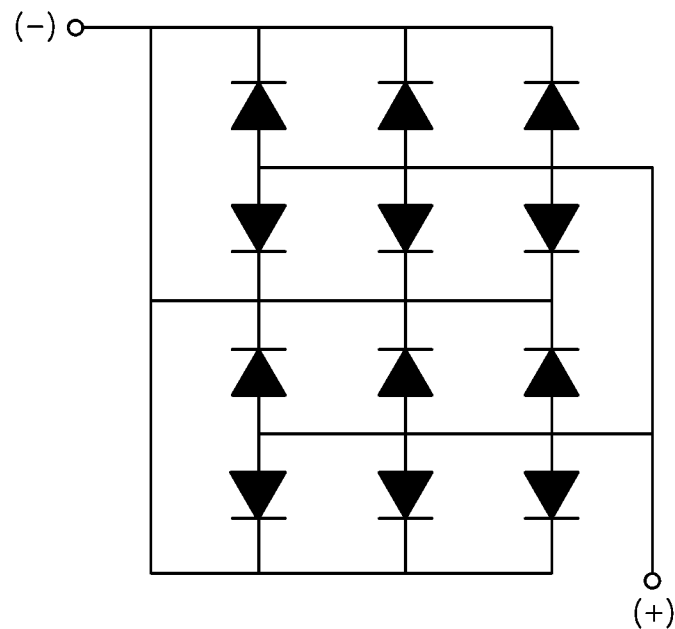
FIG. 18 is an equivalent circuit diagram of the multi-cell array semiconductor light emitting device illustrated in FIG. 17.

FIG. 17 is a plan view illustrating another example (a combination of a concavo-convex part) of a multi-cell array semiconductor light emitting device according to a third embodiment of the present invention. FIG. 18 is an equivalent circuit diagram of the multi-cell array semiconductor light emitting device illustrated in FIG. 17.

Figure 19A:
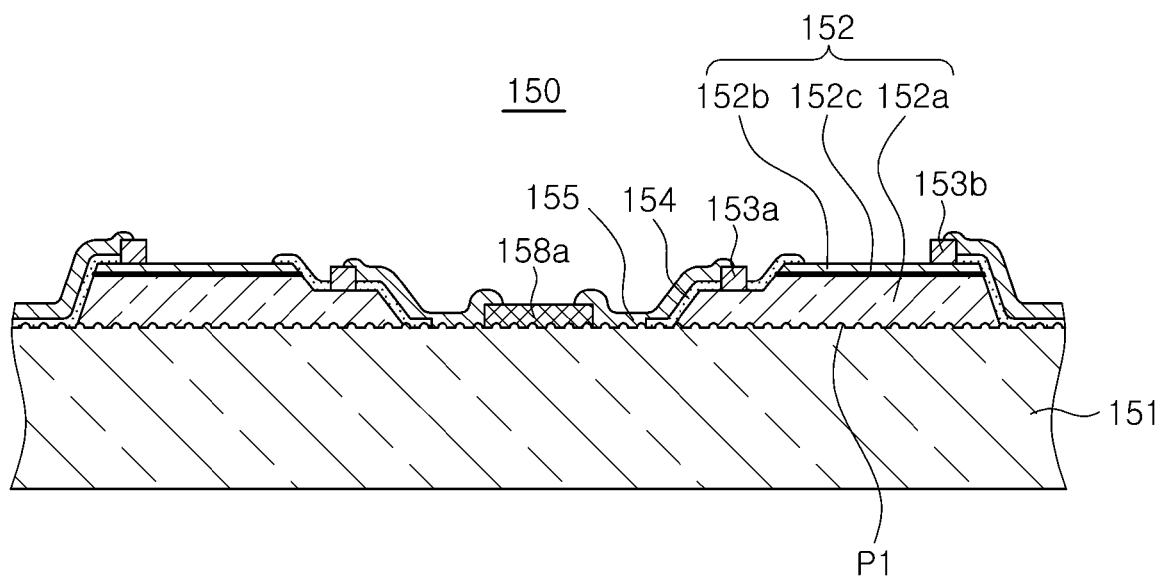
FIGS. 19A and 19B are side sectional views of the multi-cell array semiconductor light emitting device illustrated in FIG. 17, which are taken along lines X1-X1' and X2-X2' of FIG. 17.
Figure 19B:
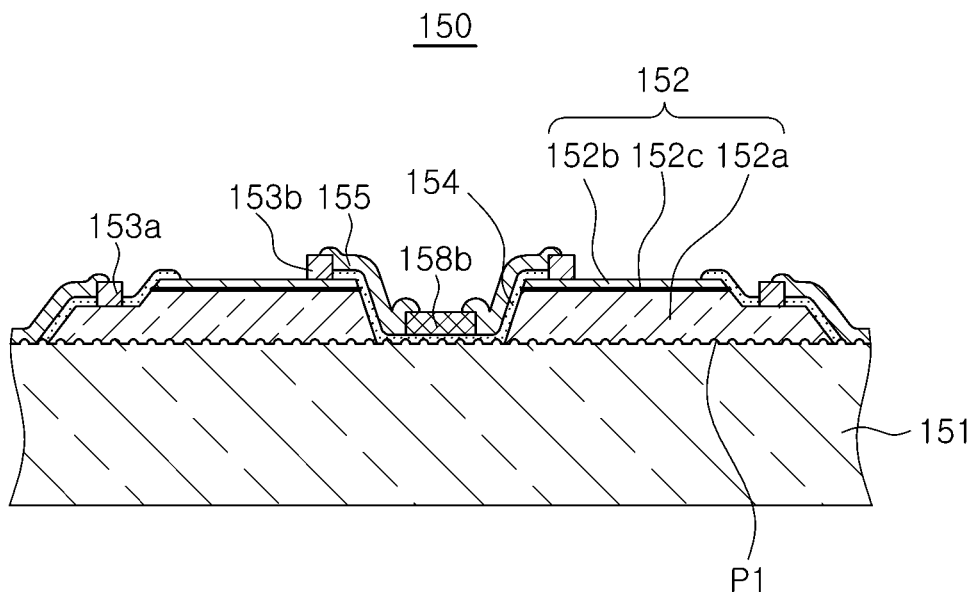

FIGS. 19A and 19B are side sectional views of the multi-cell array semiconductor light emitting device illustrated in FIG. 17, which are taken along lines X1-X1' and X2-X2' of FIG. 17.

Referring to FIGS. 19A and 19B, a multi-cell array semiconductor light emitting device 150 includes a substrate 151, and a plurality of light emitting cells C arrayed in 3×4 on the top surface of the substrate 151.

The light emitting cell C is obtained by dividing a semiconductor multilayer structure 152 having a first-conductivity-type semiconductor layer 152a, an active layer 152c, and a second-conductivity-type semiconductor layer 152b that are sequentially formed on the top surface of the substrate 151.

In this embodiment, the substrate 151 has a concavo-convex part P1 on a top surface thereof. As illustrated in FIGS. 1 and 3B, the concavo-convex part P1 of this embodiment is not limited to between the isolation regions but is formed throughout almost the entire top surface to include the region of the cell C. In this case, it can be provided in a structure for the improvement of the light extraction efficiency through the isolation region between cells.

As illustrated in FIGS. 19A and 19B, the concavo-convex part P1 is illustrated as being a convex part with a curved surface; however, the present invention is not limited thereto. For example, the concavo-convex part P1 may have various shapes such as an angled concave part and/or convex part.

In this embodiment, the semiconductor multilayer structure 152 is completely removed to expose the substrate in order to isolate the region for forming pads 159a and 159b on the top surface adjacent to the edge. Also, the first-conductivity-type semiconductor layer 102a is exposed through a mesa etching process to secure an electrode forming region.

The cell isolation by the mesa etching process may be used according to a desired connection method. That is, it may be suitably applied to a circuit capable of sharing the first-conductivity-type semiconductor layer 102a and a line disposed thereon and corresponding to a first polarity.

As illustrated in FIG. 17, the line obtained by the isolation process of FIG. 17 is represented by 'IL', and the line obtained by the mesa etching process is represented by 'ML'.

First and second electrodes 153a and 153b may be respectively formed on the exposed top surface of the first-conductivity-type semiconductor layer and the top surface of the second-conductivity-type semiconductor layer 152b. As illustrated in FIGS. 17, 19A and 19b, the first and second electrodes 153a and 153b have a line shape, and they are arranged in parallel at regular intervals for uniform current distribution over the entire area; however, the present invention is not limited thereto.

In this embodiment, the connection part includes first and second connection parts 158a and 158b and an interconnection part 155 in order to connect all of the light emitting cells in parallel, as illustrated in FIG. 18. The first and second connection parts 158a and 158b may extend respectively from the first and second pads 159a and 159b, and may be respectively connected by the interconnection part 155 to the first and second electrodes 153a and 153b.

As illustrated in FIGS. 19A and 19B, if the substrate 151 is an insulative substrate, the first and second connection parts 158a and 158b may be directly formed on the top surface of the substrate. Also, the interconnection part 155 may be formed on the insulation layer 154 in order to prevent an undesired connection with the light emitting cell C.

In this embodiment, in order to provide a uniform current distribution over all the light emitting cells C to improve the efficiency, it may be arranged in parallel to the first connection part 158a like the second electrode 153b. In this embodiment, the first and second connection parts 158a and 158b are disposed between the adjacent rows of the light emitting cells, thereby simplifying the interconnection structure.

In the semiconductor light emitting device 100 of FIG. 17, the first and second bonding pads 159a and 159b connected to the first and second connection parts 158a and 158b are disposed in the region cleared of the semiconductor multilayer structure 152.

In this embodiment, only one bonding pad (159a, 159b) is provided for each polarity; however, the present invention is not limited thereto. That is, a plurality of bonding pads may be formed at regular intervals along the line of the corresponding connection parts.

In this manner, without being formed directly with the cell, the pad is formed in the region cleared of the semiconductor multilayer structure 152, thereby providing a relatively uniform current to the directly connected light emitting cell C. Accordingly, the current concentration is prevented, thereby improving the light efficiency.

Specifically, the region for the pads 159a and 159b are formed in the adjacent edge region where the first and second connection parts 158a and 158b are formed. That is, in order to form the first and second connection parts 158a and 158b, the semiconductor multilayer region not participating in light emission is used to dispose the first and second bonding pads 159a and 159b. Accordingly, it does not greatly affect the total effective light emission area versus the substrate area.

As described above, the concavo-convex part of the isolation may be implemented in combination with the pad forming location for uniform current distribution. Likewise, the above various embodiments may be implemented in various types in combination with each other.

FIGS. 20A through 20F are cross-sectional views illustrating an example of a process for fabricating a multi-cell array semiconductor light emitting device according to an embodiment of the present invention.

Figure 20A:
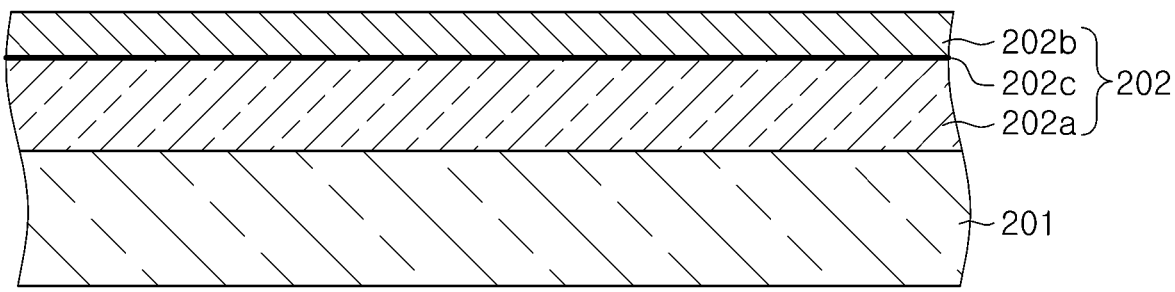
FIGS. 20A through 20F are cross-sectional views illustrating an example of a process for fabricating a multi-cell array semiconductor light emitting device according to an embodiment of the present invention.

Referring to FIG. 20A, a semiconductor multilayer structure 202 for light emission is formed on the top surface of a substrate 201. That is, a first-conductivity-type semiconductor layer 202a, an active layer 202c, and a second-conductivity-type semiconductor layer 202b are sequentially formed on the substrate 201.

The substrate 201 may be an insulative substrate such as a sapphire substrate; however, the present invention is not limited thereto. For example, the substrate 201 may be a conductive substrate. If a conductive substrate is used as the substrate 201, because an electrode of the light emitting cell is connected by the conductive substrate, another electrode with the opposite polarity may be interconnected by forming an interconnection on the top surface of the cell. In the case of the embodiment of FIGS. 17 and 19, the substrate may be a substrate having a concavo-convex portion.

Figure 20B:
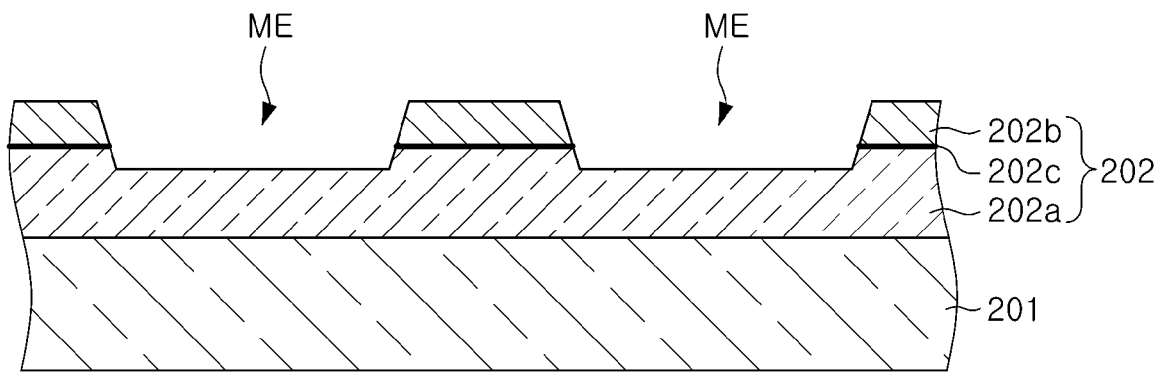

Referring to FIG. 20B, a mesa etching process for primary isolation is performed to selectively remove the second-conductivity-type semiconductor layer 202b, the active layer 202c, and a portion of the first-conductivity-type semiconductor layer 202a, thereby exposing the first-conductivity-type semiconductor layer region.

In this process, the mesa etching region ME includes an isolation region IE and a region where a first electrode will be formed.

Figure 20C:
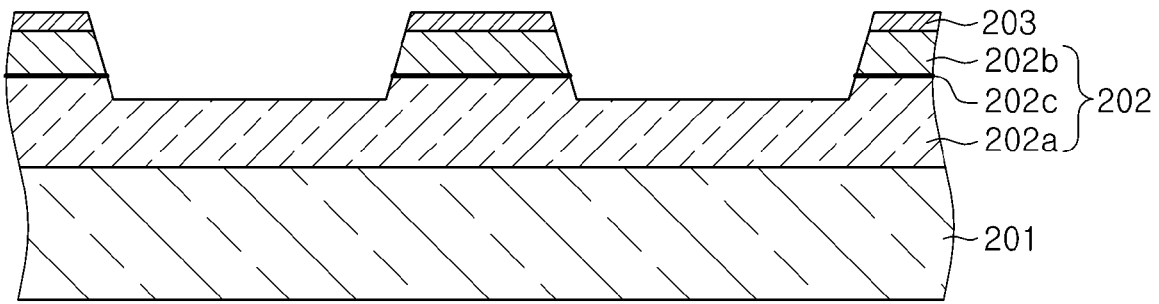
Figure 20D:
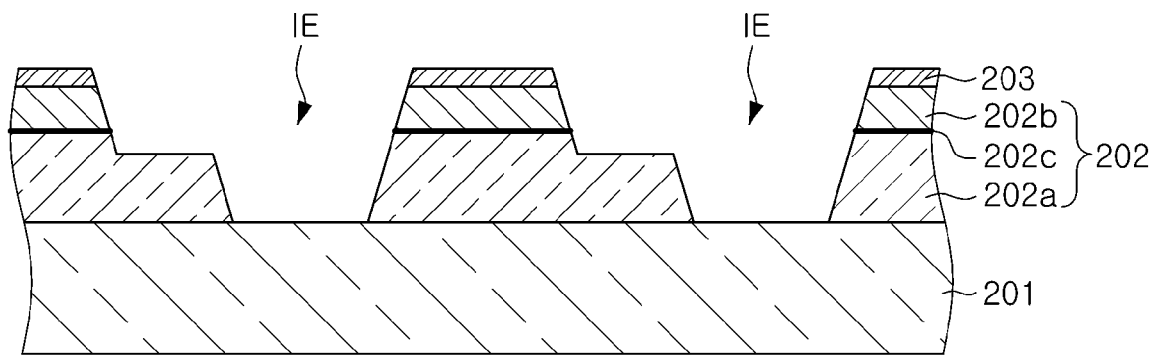

Referring to FIG. 20C, a transparent electrode 203 is formed on the second-conductivity-type semiconductor layer 202b. Referring to FIG. 20D, a complete isolation process is performed to form an isolation region IE exposing the surface of the substrate 201, in order to obtain a plurality of light emitting cells.

The processes of FIGS. 20B to 20D may vary according to embodiments. For example, although it has been described that the completion isolation process is performed after the mesa etching process, the mesa etching process may be performed separately after performing the completion isolation process.

Also, the transparent electrode forming process may be omitted, or the transparent electrode may be formed after the isolation process.

Figure 20E:
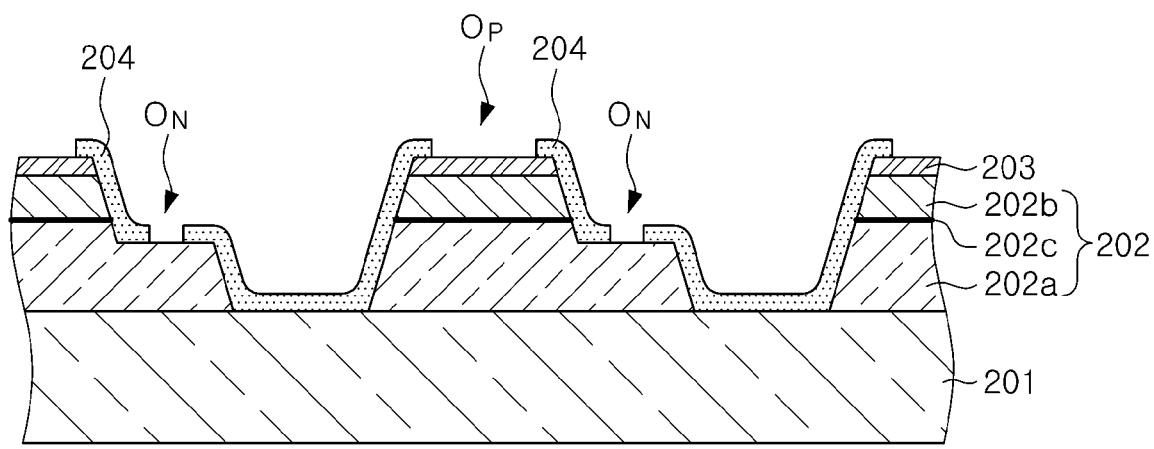

Referring to FIG. 20E, an insulating layer 204 is formed, and open regions ON and OP are formed to selectively expose the first-conductivity-type semiconductor layer 202a and the second-conductivity-type semiconductor layer 202b for connection with a connection part.

Figure 20F:
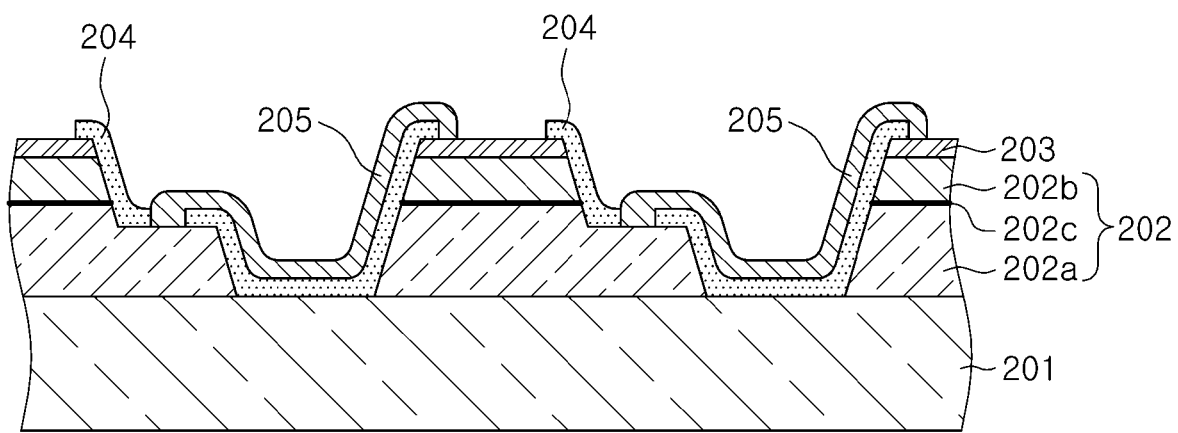

Referring to FIG. 20F, a connection part 205 for interconnection is formed. For a series connection structure, the connection part 205 may be formed to connect the first-conductivity-type semiconductor layer 202a and the second-conductivity-type semiconductor layer 202b.

The multi-chip array semiconductor light emitting device according to the embodiments of the present invention may be used as a chip in a module including a device having an electrode part like a printed circuit board. Also, the aforesaid light emitting devices and light emitting modules may be implemented as an illumination apparatus including a driving unit.

Figure 21A:
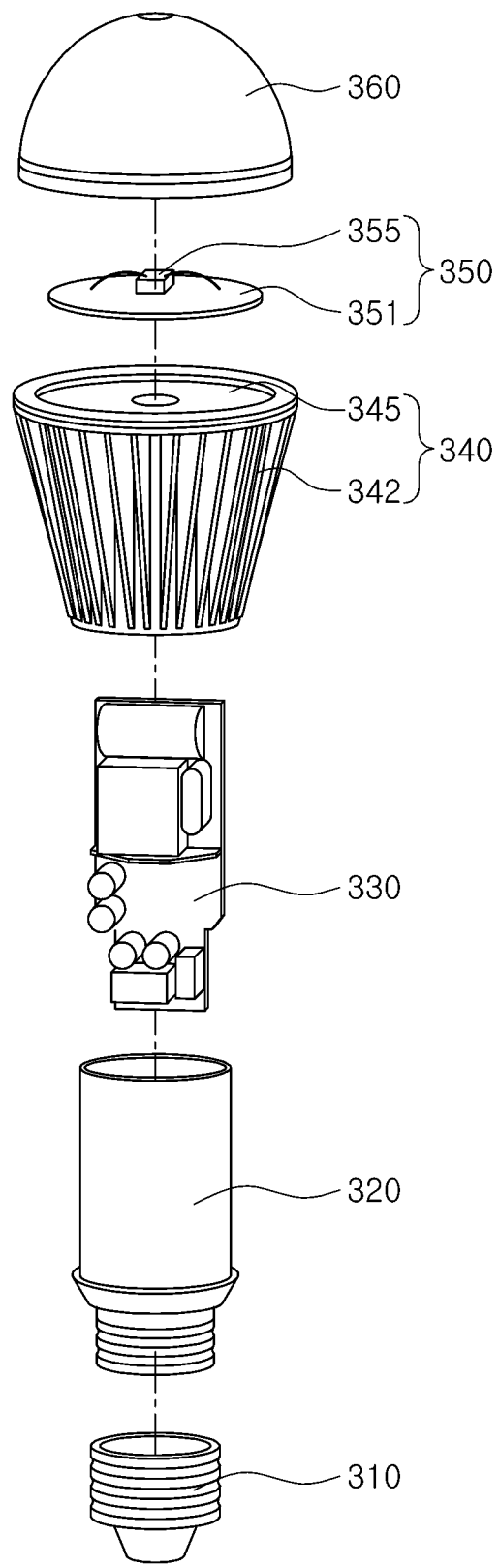
FIGS. 21A and 21B are respectively an exploded perspective view and a schematic perspective view of an illumination apparatus including a multi-cell array semiconductor light emitting device according to an embodiment of the present invention.
Figure 21B:
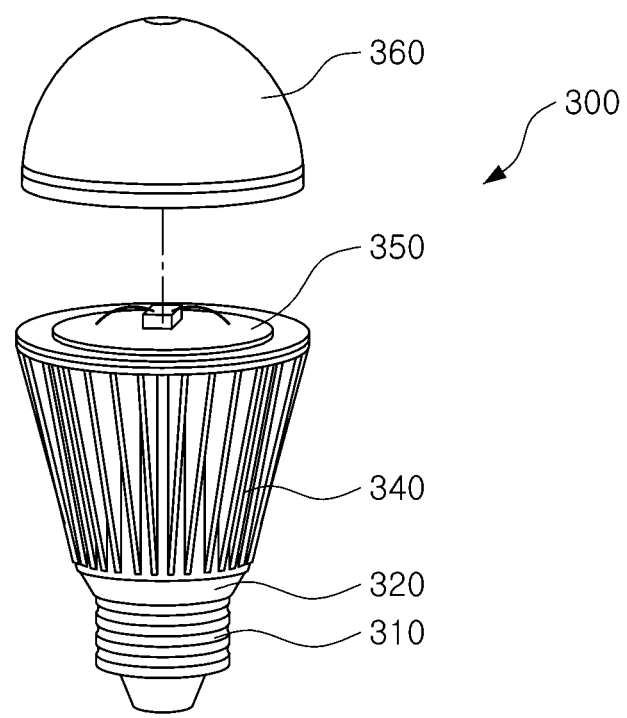

FIGS. 21A and 21B are respectively an exploded perspective view and a schematic perspective view of an illumination apparatus including a multi-cell array semiconductor light emitting device according to an embodiment of the present invention.

FIGS. 21A and 21B illustrate a bulb-type lamp as an example of the illumination apparatus according to the present invention.

Referring to FIGS. 21A and 21B, an illumination apparatus 300 includes a light emitting module 350, a driving unit 330, and an external connection unit 310. The illumination apparatus 300 may further include external structures such as an outer housing 340 and an inner housing 320.

The light emitting module 350 may include a multi-chip array light emitting device 355 and a circuit board 351 mounting the multi-chip array light emitting device 355. In this embodiment, one multi-chip array light emitting device 355 is mounted on the circuit board 351; however, the present invention is not limited thereto. That is, a plurality of multi-chip array light emitting devices may be mounted on the circuit board 351.

The light emitting module 350 may include the outer housing 340 acting as a heat emission part. The outer housing 340 may include a heat dissipation plate 345 that is directly connected to the light emitting module 350 to improve the heat dissipation effect. Also, the illumination apparatus 300 may include a cover part 360 that is mounted on the light emitting module 350 and has the shape of a convex lens.

The driving unit 330 is mounted in the inner housing 320 and is connected to the external connection unit 310 to receive power from an external power supply unit.

Also, the driving unit 330 is configured to drive the multi-chip array light emitting device 355 of the light emitting module by converting the received power into a current and providing the same to the multi-chip array light emitting device 355. For example, the driving unit 330 may include an AC-DC converter or a rectifier circuit.

The aforesaid light emitting devices and light emitting modules may be used in various apparatuses such as indoor illumination apparatuses (e.g., lamps), outdoor illumination apparatuses (e.g., street lamp and signboards), and traffic illumination apparatuses (e.g., head lamps and rear lamps for vehicles such as cars, airplanes and ships). The illumination apparatus may further include a heat dissipation member and/or a reflection plate.

As described above, the present invention implements a large-area semiconductor multilayer structure, forms a plurality of light emitting cells corresponding to sub-chips through typical isolation processes (e.g., a complete isolation process and a mesa etching process for partial isolation), connects the light emitting cells by metal electrodes rather than by wire, and drives the connected structure like a single chip, thereby overcoming the problems caused when the chips are connected by wire (e.g., a complex fabrication process, a wire open failure, and a difficulty in miniaturization).

Also, the present invention provides the concavo-convex parts on the bottom surface of the substrate and/or the isolation region between light emitting cells to effectively extract light, which may be wasted by being confined in the substrate or the lower semiconductor layer (the first-conductivity-type semiconductor layer) or by being emitted to the side surfaces thereof, thereby improving the light efficiency.

Also, the present invention provides the reflection member on the bottom surface of the substrate and/or the isolation region between light emitting cells to guide light, which may be wasted by being confined in the substrate or the lower semiconductor layer (the first-conductivity-type semiconductor layer) or by being emitted to the side surfaces thereof, through an effective path, thereby improving the substantial light efficiency.

Also, the present invention changes the location and structure of the pad, thereby securing a uniform current distribution and a sufficient light emission area.

While the present invention has been shown and described in connection with the exemplary embodiments, it will be apparent to those skilled in the art that modifications and variations can be made without departing from the spirit and scope of the invention as defined by the appended claims.

What is claimed is:

1. A semiconductor light emitting device comprising:
a substrate;
a plurality of light emitting cells arrayed on a top surface of the substrate, the light emitting cells each having a first-conductivity-type semiconductor layer, an active layer, and a second-conductivity-type semiconductor layer that are sequentially stacked on the top surface of the substrate;
a connection part electrically connecting the light emitting cells in series, parallel, or series-parallel; and
a concavo-convex part disposed in a bottom surface of the substrate opposite to the top surface having the plurality of light emitting cells arrayed thereon,
wherein the concavo-convex part includes a groove part having:
a groove top surface substantially parallel to the bottom surface of the substrate; and
a groove side surface disposed between the groove top surface and the bottom surface of the substrate and inclined with respect to the bottom surface of the substrate.

2. The semiconductor light emitting device of claim 1, wherein the connection part is disposed on the top surface of the substrate in an isolation region located between adjacent light emitting cells, and
wherein the concavo-convex part is further disposed in the top surface of the substrate only in a portion of the isolation region on the top surface of the substrate in which the connection part is not disposed.

3. The semiconductor light emitting device of claim 2, wherein the isolation region comprises a region exposing the substrate, and
the concavo-convex part is formed in the exposed region of the substrate.

4. The semiconductor light emitting device of claim 2, wherein the isolation region comprises a region exposing the first-conductivity-type semiconductor layer, and the concavo-convex part is formed in the exposed region of the first-conductivity-type semiconductor layer.

5. The semiconductor light emitting device of claim 4, wherein the concavo-convex part is formed in the majority of the regions of the top surface of the substrate.

6. The semiconductor light emitting device of claim 1, further comprising a second concavo-convex part formed on the top surface of an isolation region located between adjacent light emitting cells.

7. The semiconductor light emitting device of claim 1, further comprising a reflective metal layer formed on the bottom surface of the substrate.

8. The semiconductor light emitting device of claim 7, further comprising a dielectric layer formed between the reflective metal layer and the rear surface of the substrate and having a lower refractivity than that of the substrate.

9. The semiconductor light emitting device of claim 1, wherein each of the light emitting cells comprises a plurality of groups divided by two or more light emitting cells, and the connection part comprises:

a plurality of interconnection parts formed between the adjacent light emitting cells to connect the light emitting cells of the same group in series;

at least one first connection part connected to the first-conductivity-type semiconductor layer of the light emitting cell located at one end of each of the groups; and at least one second connection part connected to the second-conductivity-type semiconductor layer of the light emitting cell located at the other end of each of the groups.

10. The semiconductor light emitting device of claim 9, wherein the groups have the same number of light emitting cells.

11. The semiconductor light emitting device of claim 1, wherein the connection part comprises:

at least one first connection part connected to the first-conductivity-type semiconductor layer of the light emitting cells; and at least one second connection part connected to the second-conductivity-type semiconductor layer of the light emitting cells.

12. The semiconductor light emitting device of claim 11, further comprising:

at least one first bonding pad connected to the first connection part; and at least one second bonding pad connected to the second connection part.

13. The semiconductor light emitting device of claim 11, wherein at least one of the first and second bonding pads is located in a region of the top surface of the substrate adjacent to one edge, and the connection part is formed in the region of the top surface adjacent to the edge, in which the first or second bonding pad is formed.

14. The semiconductor light emitting device of claim 11, wherein at least one of the first and second bonding pads is formed on a portion of a semiconductor multilayer structure that is located in a region of the top surface of the substrate adjacent to one edge and does not participate in emitting light.

15. The semiconductor light emitting device of claim 11, wherein the light emitting cells have approximately the same active layer area.

16. The semiconductor light emitting device of claim 15, wherein the light emitting cell has a first-conductivity-type semiconductor exposing region wider than the first-conductivity-type semiconductor exposing region of another light emitting cell, and the first bonding pad is formed on the first-conductivity-type semiconductor exposing region of the light emitting cell.

17. The semiconductor light emitting device of claim 16, wherein the second bonding pad is located in a region of the top surface of the substrate adjacent to one edge, and the connection part is formed in the region of the top surface adjacent to the edge, in which the second bonding pad is formed.

18. The semiconductor light emitting device of claim 16, wherein the second bonding pad is formed on a portion of a semiconductor multilayer structure that is located at one edge of the top surface of the substrate and does not participate in emitting light.

19. A light emitting module comprising at least one semiconductor light emitting device according to claim 1.

20. An illumination apparatus comprising a light emitting module according to claim 19.

21. An illumination apparatus comprising at least one semiconductor light emitting device according to claim 1.

22. The semiconductor light emitting device of claim 1, further comprising a reflective metal layer formed on the bottom surface of the substrate, on the groove top surface of the concavo-convex part, and on the groove side surface of the concavo-convex part.

23. The semiconductor light emitting device of claim 1, wherein the concavo-convex part is disposed in the region corresponding to an isolation region located between the adjacent light emitting cells.

* * * * *